US011501834B2

(12) United States Patent
Shibata et al.

(10) Patent No.: US 11,501,834 B2
(45) Date of Patent: *Nov. 15, 2022

(54) SEMICONDUCTOR MEMORY SYSTEM INCLUDING FIRST AND SECOND SEMICONDUCTOR MEMORY CHIPS AND A COMMON SIGNAL LINE

(71) Applicant: Kioxia Corporation, Tokyo (JP)

(72) Inventors: Noboru Shibata, Kawasaki (JP); Hiroshi Sukegawa, Minato-ku (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/180,938

(22) Filed: Feb. 22, 2021

(65) Prior Publication Data

US 2021/0174876 A1 Jun. 10, 2021

Related U.S. Application Data

(60) Continuation of application No. 16/671,692, filed on Nov. 1, 2019, now Pat. No. 10,964,394, which is a (Continued)

(30) Foreign Application Priority Data

Feb. 9, 2007 (JP) ................... 2007-030789

(51) Int. Cl.
G11C 16/00 (2006.01)
G11C 16/10 (2006.01)
(Continued)

(52) U.S. Cl.
CPC .......... *G11C 16/10* (2013.01); *G11C 11/5628* (2013.01); *G11C 16/0483* (2013.01);
(Continued)

(58) Field of Classification Search
CPC .................................................. G11C 16/0483
(Continued)

(56) References Cited

U.S. PATENT DOCUMENTS 5,075,890 A 12/1991 Itoh et al.
5,818,350 A * 10/1998 Estakhri ................... G11C 8/12
340/9.16

(Continued)

FOREIGN PATENT DOCUMENTS

JP 11-242632 9/1999
JP 11-317089 11/1999
(Continued)

OTHER PUBLICATIONS

Office Action dated Sep. 15, 2011 in the corresponding Taiwan Patent Application No. 097104713.
(Continued)

*Primary Examiner* — Hoai V Ho
(74) *Attorney, Agent, or Firm* — Oblon, McClelland, Maier & Neustadt, L.L.P.

(57) ABSTRACT

A communication line is connected to first and second chips, and held at a first signal level. A monitor circuit changes a signal level of the communication line from the first signal to a second signal level while one of the first and second chips uses a current larger than a reference current. When the signal level of the communication line is the second signal level, the other of the first and second chips is controlled to a wait state that does not transfer to an operating state of using a current larger than the reference current.

13 Claims, 22 Drawing Sheets

Related U.S. Application Data continuation of application No. 15/881,265, filed on Jan. 26, 2018, now Pat. No. 10,482,970, which is a continuation of application No. 15/430,983, filed on Feb. 13, 2017, now Pat. No. 9,928,913, which is a continuation of application No. 14/539,522, filed on Nov. 12, 2014, now Pat. No. 9,601,206, which is a division of application No. 14/073,521, filed on Nov. 6, 2013, now Pat. No. 8,908,433, which is a division of application No. 13/598,099, filed on Aug. 29, 2012, now Pat. No. 8,593,880, which is a division of application No. 12/645,104, filed on Dec. 22, 2009, now Pat. No. 8,284,607, which is a division of application No. 12/027,546, filed on Feb. 7, 2008, now Pat. No. 7,656,711.

(51) Int. Cl.
| | |
|---|---|
| G11C 11/56 | (2006.01) |
| G11C 16/04 | (2006.01) |
| G11C 16/08 | (2006.01) |
| G11C 16/16 | (2006.01) |
| G11C 16/26 | (2006.01) |
| G11C 16/34 | (2006.01) |
| G11C 16/30 | (2006.01) |

(52) U.S. Cl.
CPC .............. *G11C 16/08* (2013.01); *G11C 16/16* (2013.01); *G11C 16/26* (2013.01); *G11C 16/3459* (2013.01); *G11C 16/30* (2013.01)

(58) Field of Classification Search
USPC .................................................. 365/185.17
See application file for complete search history.

(56) References Cited

U.S. PATENT DOCUMENTS

| 6,088,264 | A | 7/2000 | Hazen et al. |
|---|---|---|---|
| 6,301,165 | B1 | 10/2001 | Kim |
| 6,385,107 | B1 | 5/2002 | Bedarida et al. |
| 6,643,162 | B2 | 11/2003 | Takeuchi et al. |
| 7,251,739 | B1* | 7/2007 | Rudelic .................. G11C 16/30 |
| | | | 713/330 |
| 7,353,323 | B2 | 4/2008 | Polyudov |
| 7,656,711 | B2 | 2/2010 | Shibata |
| 8,284,607 | B2 | 10/2012 | Shibata et al. |
| 8,593,880 | B2 | 11/2013 | Shibata |
| 8,892,917 | B2 | 11/2014 | Sukegawa |
| 8,908,433 | B2 | 12/2014 | Shibata |
| 9,601,206 | B2 | 3/2017 | Shibata |
| 10,482,970 | B2 | 11/2019 | Shibata |
| 10,964,394 | B2* | 3/2021 | Shibata .................. G11C 16/10 |
| 2002/0054531 | A1 | 5/2002 | Aruga |
| 2003/0022411 | A1 | 1/2003 | Sumitani |
| 2003/0043686 | A1* | 3/2003 | Lee ........................ G11C 16/08 |
| | | | 365/244 |
| 2004/0089717 | A1 | 5/2004 | Harari et al. |
| 2004/0123060 | A1* | 6/2004 | Bodas .................. G06F 13/4243 |
| | | | 711/167 |
| 2004/0208059 | A1 | 10/2004 | Lee |
| 2005/0128809 | A1 | 6/2005 | Kawai et al. |
| 2007/0005825 | A1 | 1/2007 | Henson et al. |
| 2007/0217102 | A1 | 9/2007 | Chuang |
| 2008/0155309 | A1 | 6/2008 | Cheong et al. |
| 2015/0039921 | A1 | 2/2015 | Sukegawa |

FOREIGN PATENT DOCUMENTS

| JP | 2000-82294 | 3/2000 |
|---|---|---|
| JP | 2002-351737 | 12/2002 |
| JP | 2003-331589 | 11/2003 |
| KR | 10-0268880 | 11/1998 |
| KR | 10-0293634 | 10/1999 |
| KR | 10-0367322 | 4/2003 |
| KR | 10-0593771 | 6/2003 |

OTHER PUBLICATIONS

Office Action dated Dec. 29, 2011, in Korea patent Application No. 10-2008-11890 (with English translation).

Notice of Reasons for Rejection issued in Japanese Patent Application No. 2007-3307539 dated Jan. 10, 2012 (with English translation).

Office Action issued in corresponding Taiwan Patent Application No. 097104713 dated Apr. 18, 2013 (with english translation).

\* cited by examiner

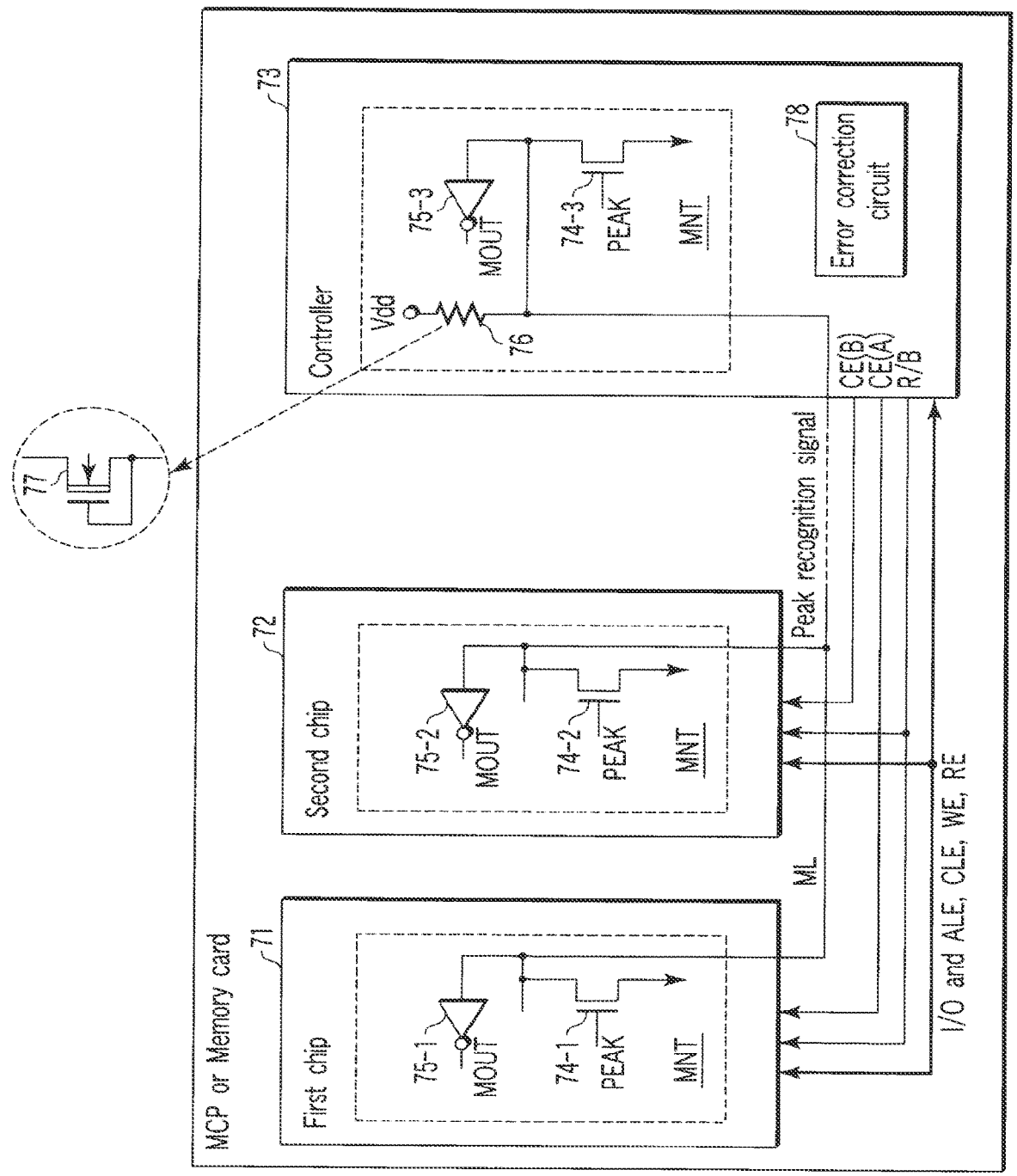
F I G. 1

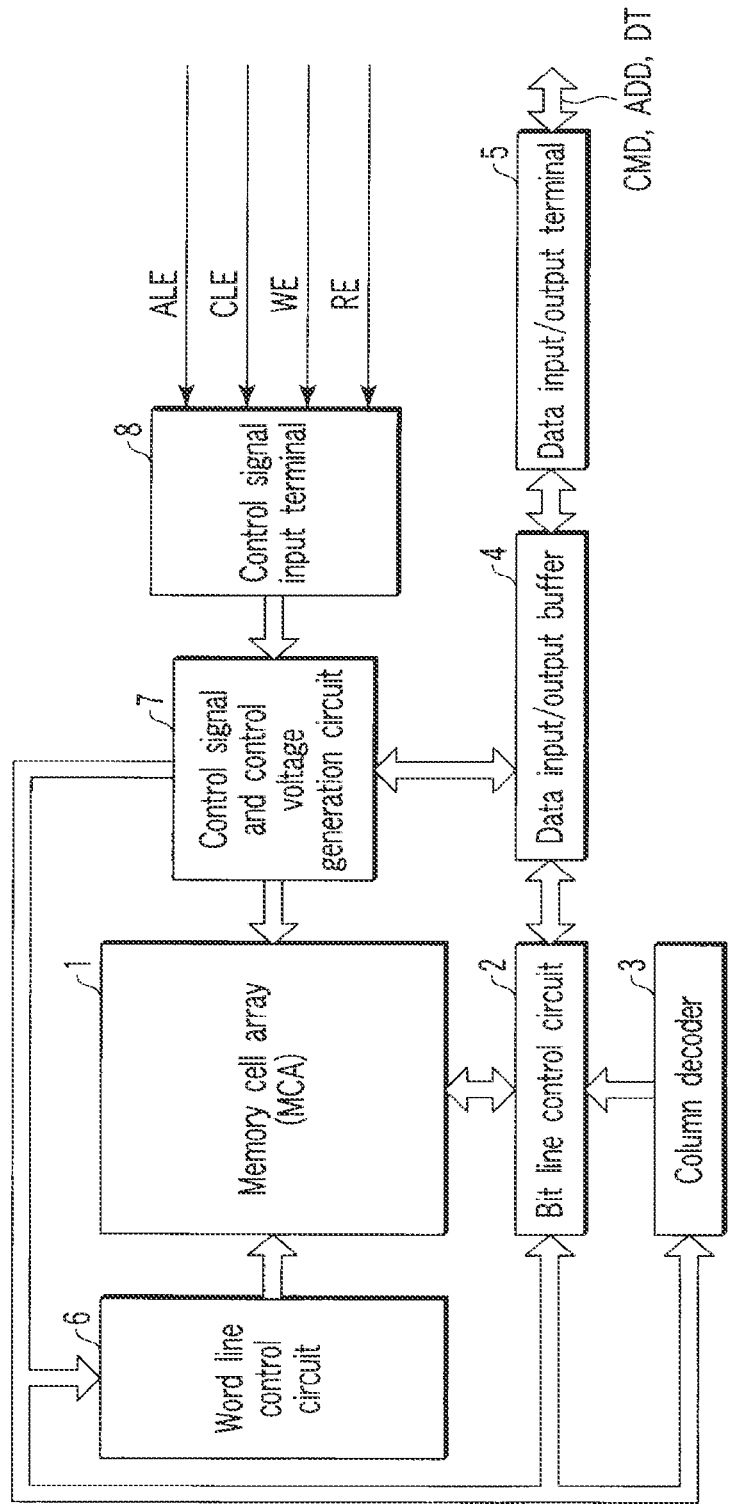
F I G. 2

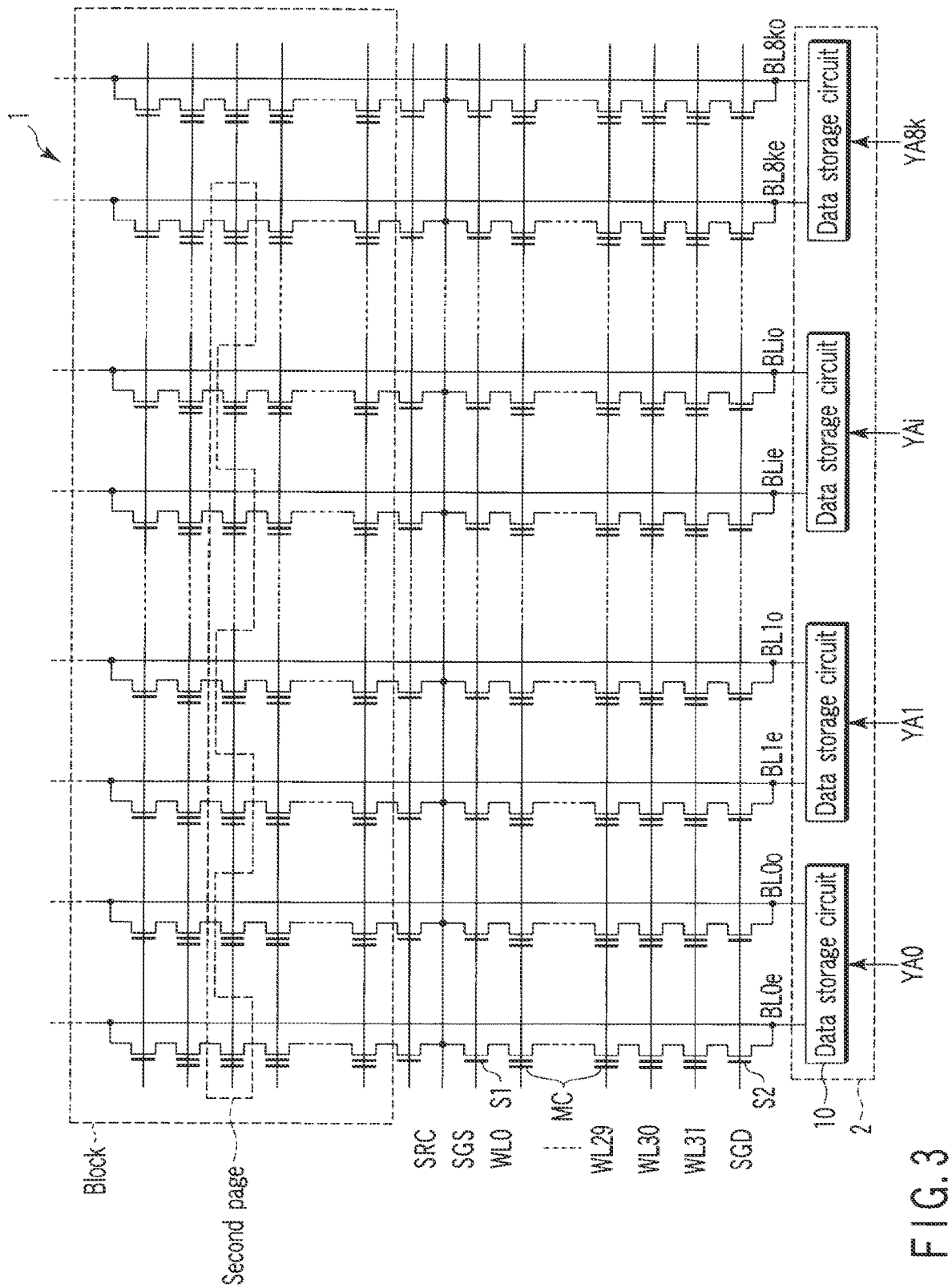
F I G. 3

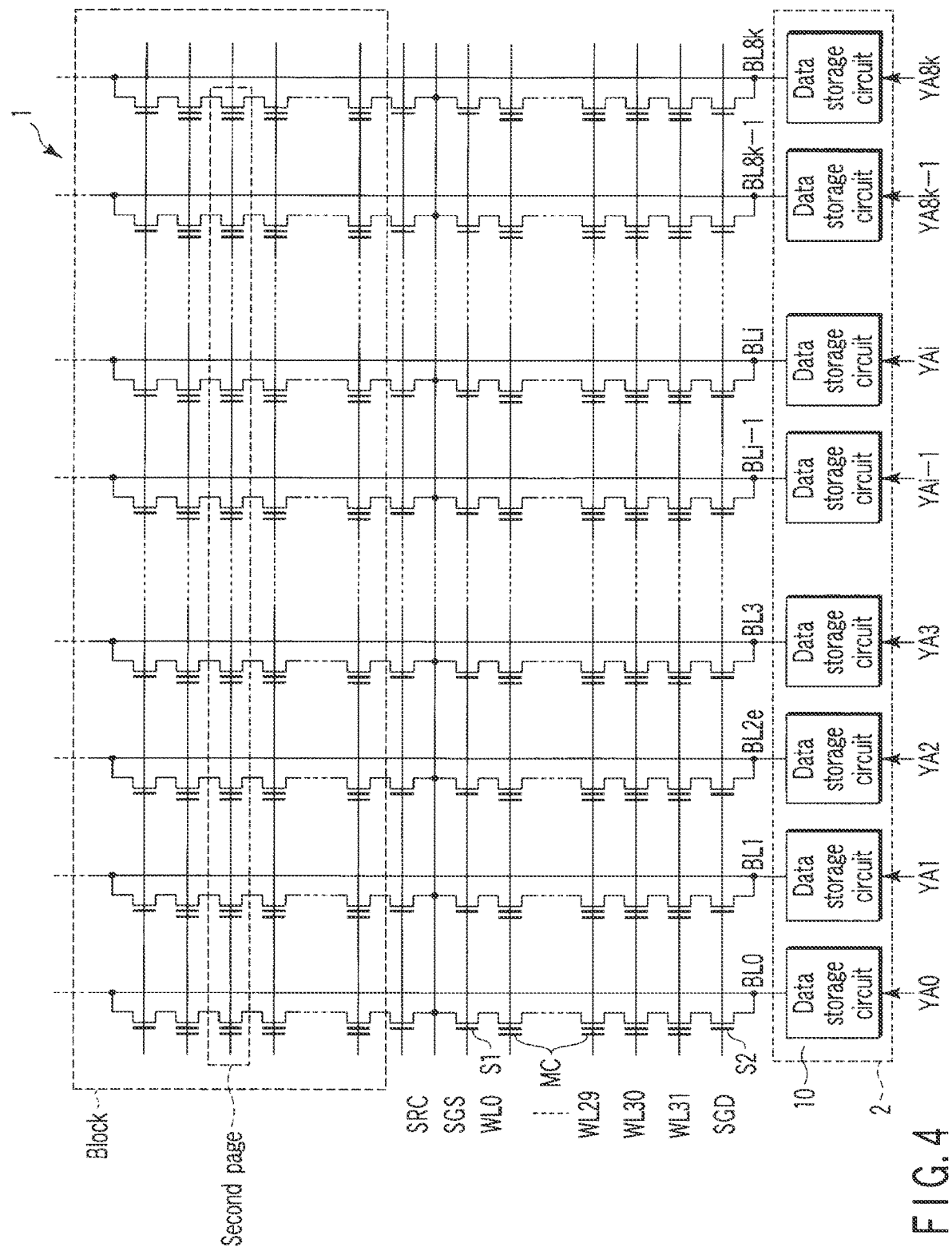
F I G. 4

| | Cell (P-Well) | Cell (N-Well) | H.V.Tr (P-sub) | L.V.Nch (P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Read | Vss (0V) | Vss (0V) | Vss (0V) | Vss (0V) | Vdd (2.5V) | Vdd (2.5V)/Vreadh+Vss |

F I G. 7

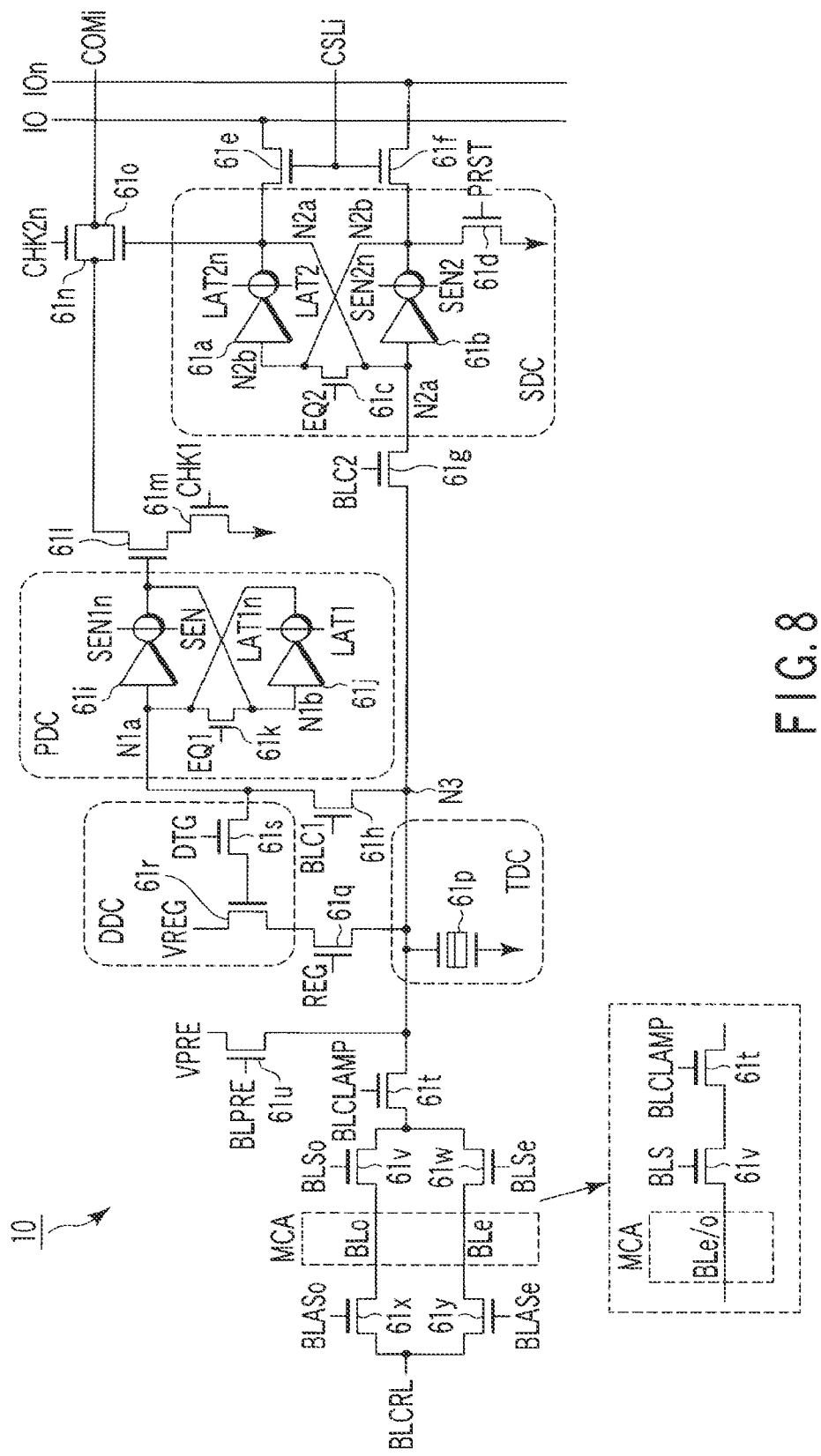
F I G. 8

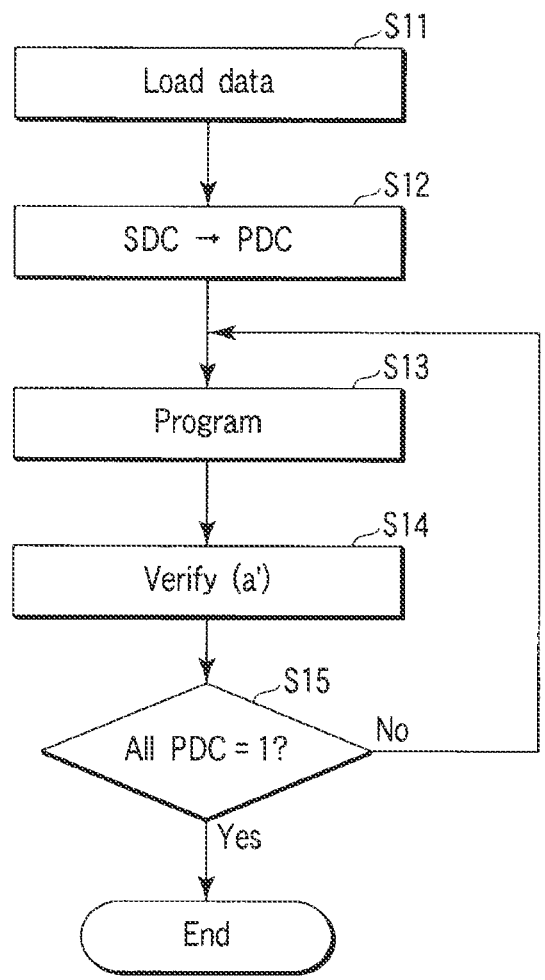
F I G. 12

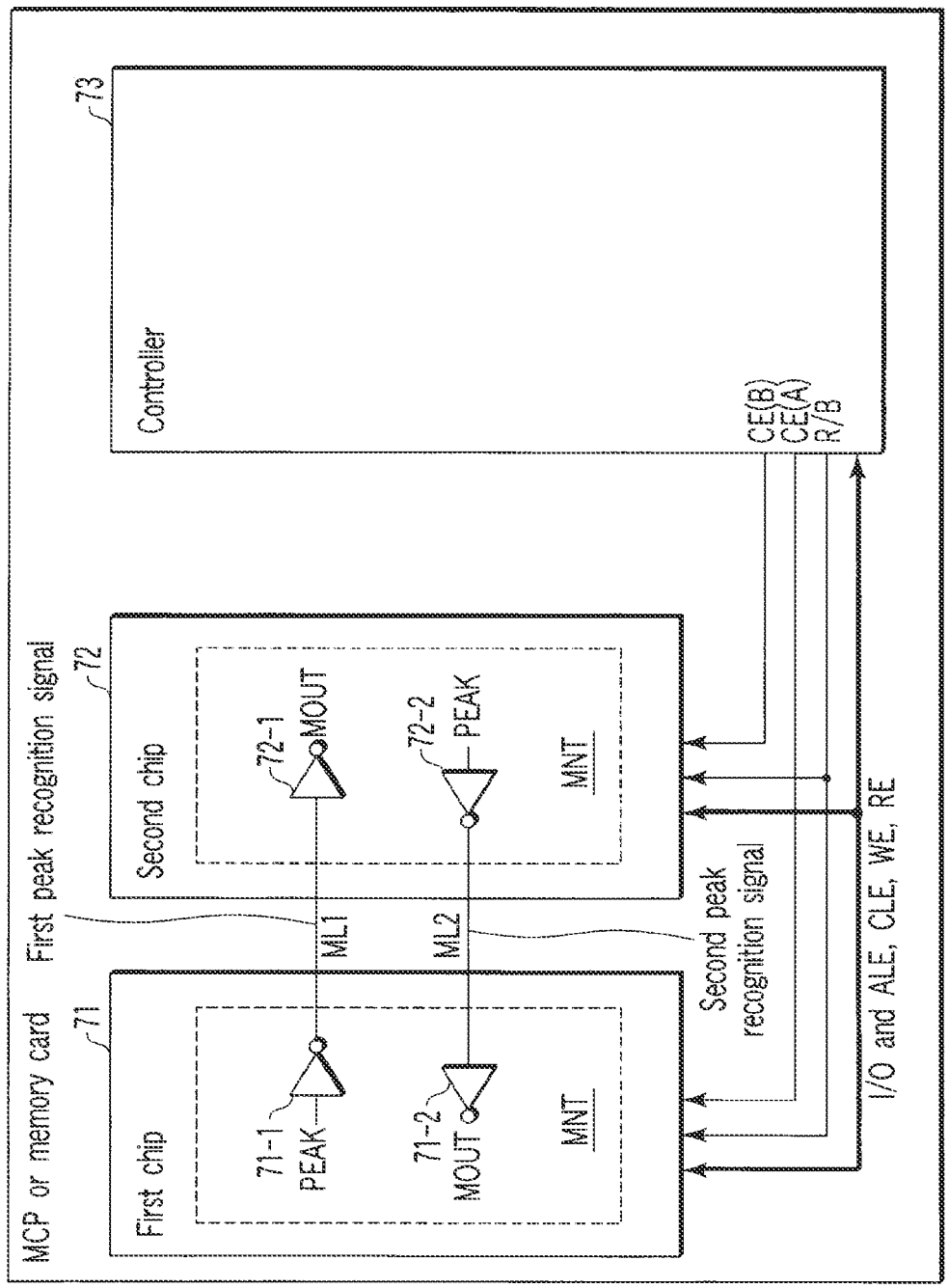
F I G. 24

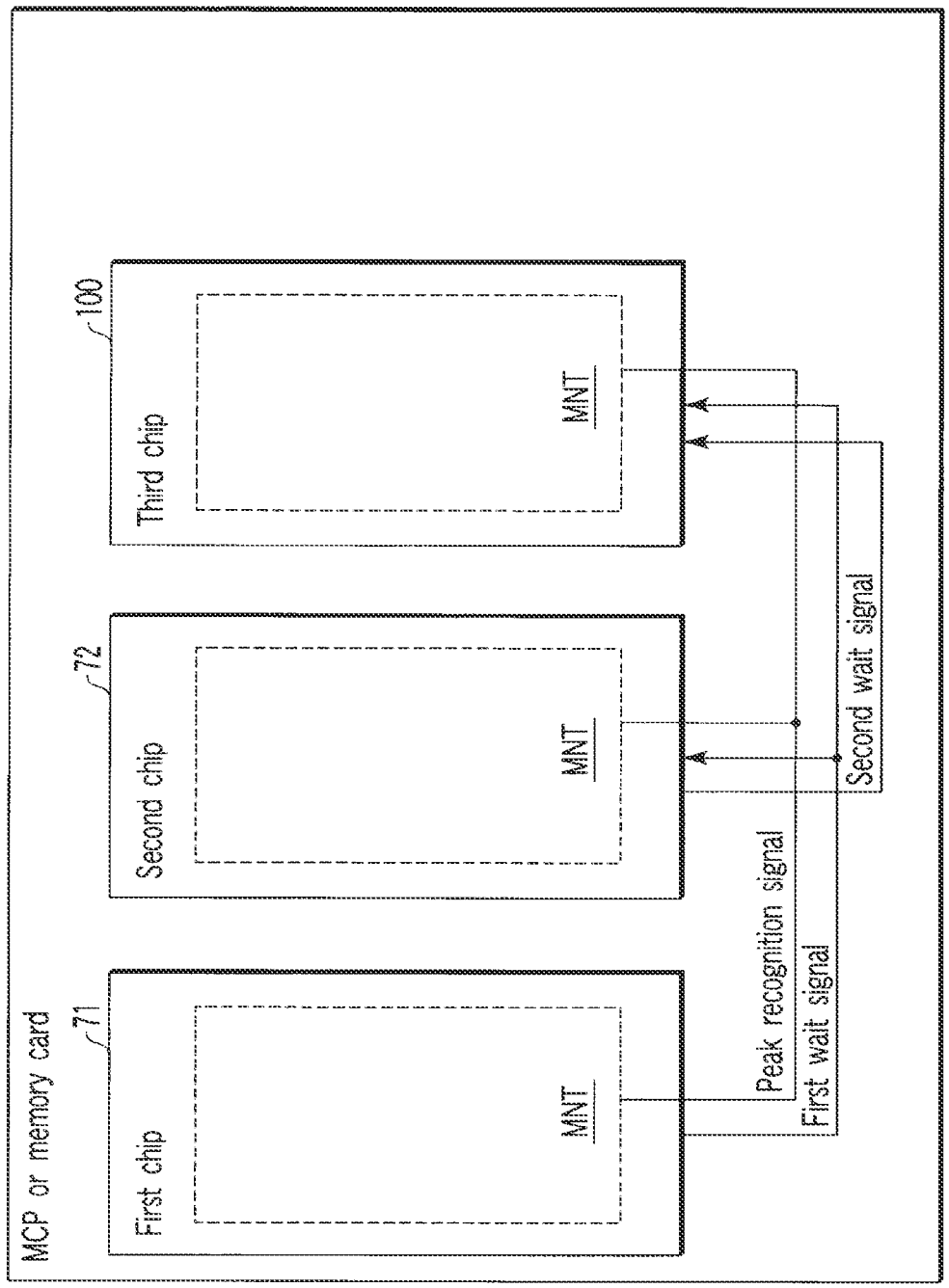
F I G. 25

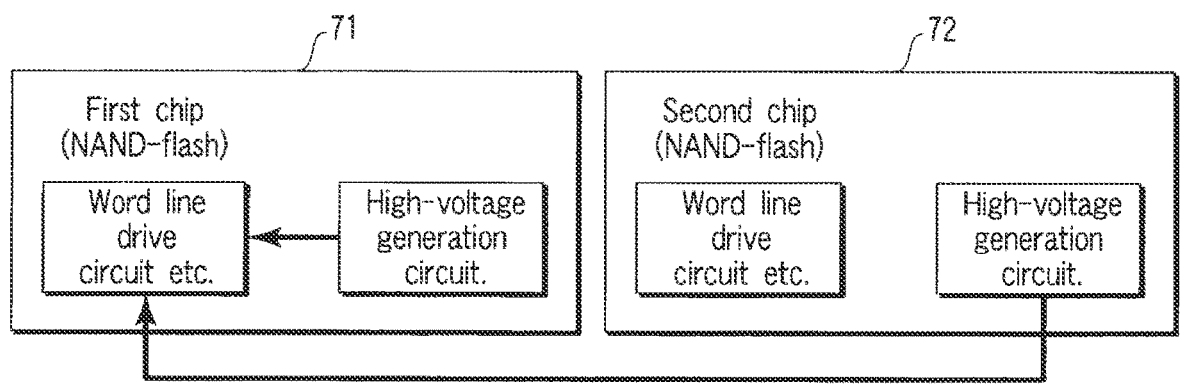
F I G. 26
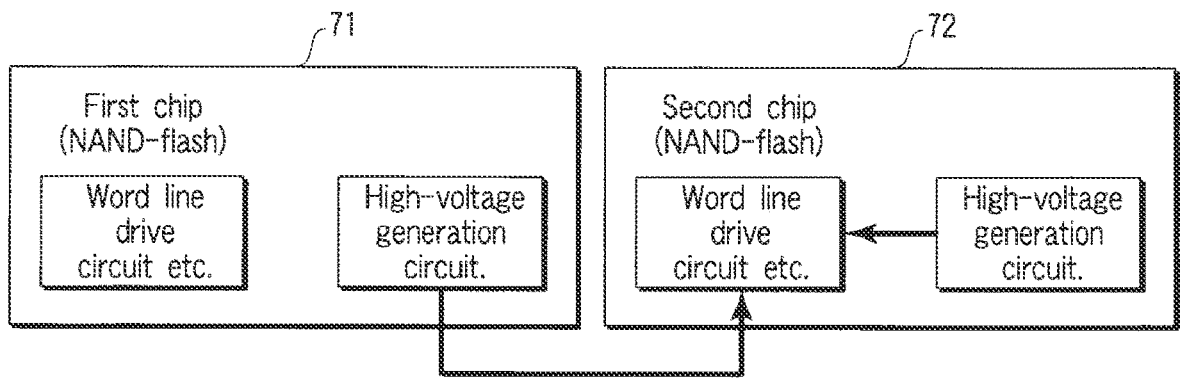
F I G. 27

SEMICONDUCTOR MEMORY SYSTEM INCLUDING FIRST AND SECOND SEMICONDUCTOR MEMORY CHIPS AND A COMMON SIGNAL LINE

CROSS-REFERENCE TO RELATED APPLICATIONS

This application is a continuation of U.S. Ser. No. 16/671,692 filed Nov. 1, 2019, which is a continuation of U.S. Ser. No. 15/881,265 filed Jan. 26, 2018, which is a continuation of U.S. Ser. No. 15/430,983 filed Feb. 13, 2017, which is a continuation of U.S. Ser. No. 14/539,522 filed Nov. 12, 2014. U.S. Ser. No. 14/539,522 is a divisional of U.S. Ser. No. 14/073,521 filed Nov. 6, 2013 which is a divisional of U.S. Ser. No. 13/598,099 filed Aug. 29, 2012, now U.S. Pat. No. 8,593,880, which is a divisional of U.S. Ser. No. 12/645,104 filed Dec. 22, 2009, now U.S. Pat. No. 8,284,607 which is a division of U.S. Ser. No. 12/027,546, filed Feb. 7, 2008, now U.S. Pat. No. 7,656,711, which is based upon and claims the benefit of priority from prior Japanese Patent Application No. 2007-030789, filed Feb. 9, 2007. The entire contents of each of these applications is incorporated herein by reference.

BACKGROUND OF THE INVENTION

1. Field of the Invention

The present invention relates to a non-volatile semiconductor memory device, for example, a NAND flash memory. In particular, the present invention relates to a semiconductor memory system including a plurality of built-in flash memories.

2. Description of the Related Art

A NAND flash memory requires the following threshold distribution within a limited threshold voltage range, for example, −2V to 5V. Specifically, if four values are given, four threshold distributions must be set. If eight values are given, eight threshold distributions must be set. If 16 values are given, 16 threshold distributions are set. In a write sequence, a program operation and a verify operation are made, and program voltage is gradually stepped up to repeat the program operation and the verify operation. As described above, the program voltage is gradually stepped up to repeat the program operation and the verify operation; for this reason, write time increases. As a result, write performance must be enhanced, and simultaneously, the number of write cells increases.

When the program operation is started, all bit lines must be charged. Moreover, when a verify read operation is started, all bit lines are charged to determine current carrying through all bit lines. Therefore, very large current is required, and thus, large peak current is temporarily generated.

The NAND flash memory is frequently used as the following multi-chip package (MCP) and memory card. The multi-chip package (MCP) has simultaneously some, for example, two to four built-in chips to increase storage capacity. The memory card has a plurality of built-in chips. As described above, when some chips are built in, if the peak current of each chip overlaps, larger peak current is generated. For this reason, there is a possibility of causing a problem such as disconnection reducing reliability.

In order to solve the foregoing problem, the following technique (e.g., see Jpn. Pat. Appln. KOKAI Publication No. 11-242632) has been developed. According to the technique, the peak value of current generated is reduced when write is concurrently made with respect to a plurality of chips. However, it is desired to prevent an increase of circuit configuration and securely and sufficiently reduce the peak current.

BRIEF SUMMARY OF THE INVENTION

According to a first aspect of the invention, there is provided a semiconductor memory system comprising: a first semiconductor memory device; a second semiconductor memory device; a common communication line connected to the first and second semiconductor memory devices, and kept at a first level; and a control circuit connected to the communication line, a control signal chancing a level of the communication line from the first level to the second level while one of the first and second semiconductor memory devices uses a current larger than a reference current, and controlling the other of the first and second semiconductor memory devices to a wait state that does not transfer to an operating state using a current larger than the reference current when the level of the communication line is the second level.

According to a second aspect of the invention, there is provided a semiconductor memory system comprising: a first semiconductor memory device; a second semiconductor memory device; a control circuit connected to the first and second semiconductor memory devices; and a voltage generation circuit provided in the control circuit, and generating a voltage, the control circuit supplying a voltage generated by the voltage generation circuit to one of the first and second semiconductor memory devices.

According to a third aspect of the invention, there is provided a semiconductor memory system comprising: a first semiconductor memory device; a second semiconductor memory device; and a control circuit connected to the first and second semiconductor memory devices, the control circuit controlling program and verify operation of the first and second semiconductor memory devices.

BRIEF DESCRIPTION OF THE SEVERAL VIEWS OF THE DRAWING

FIG. 1 shows a first embodiment, and is a view showing the configuration of a monitor circuit;

FIG. 2 is a view schematically showing the configuration of a semiconductor memory device according to a first embodiment;

FIG. 3 is a circuit diagram showing the configuration of a memory cell array;

FIG. 4 is a circuit diagram showing another configuration of a memory cell array;

FIG. 7 is a table showing voltage supplied to each area shown in FIG. 4;

FIG. 8 is a circuit diagram showing the configuration of a data storage circuit shown in FIGS. 3 and 4;

FIG. 12 is a flowchart to explain a first-page write operation;

FIG. 24 is a view showing the configuration according to a modification example of the first embodiment;

FIG. 25 is a view showing the configuration according to another modification example of the first embodiment;

FIG. 26 is a view showing the configuration according to a modification example of the fourth embodiment; and FIG. 27 is a view showing the configuration according to a modification example of the fourth embodiment.

DETAILED DESCRIPTION OF THE INVENTION

Figure 5:
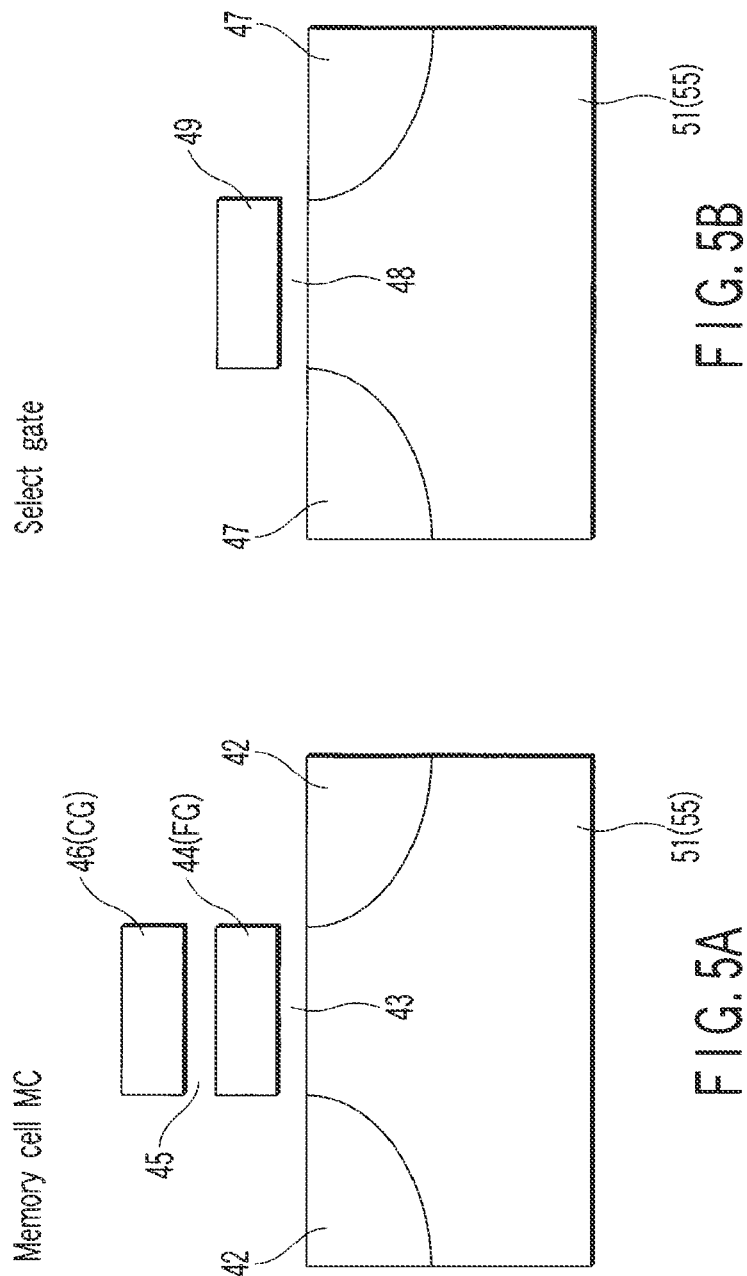
FIGS. 5A and 5B are cross-sectional views showing a memory cell and a select transistor.

Various embodiments of the present invention will be hereinafter described with reference to the accompanying drawings.

The configuration and operation of one NAND flash memory will be hereinafter described with reference to FIG. 2 to FIG. 13.

FIG. 2 is a view schematically showing the configuration of a NAND flash memory storing the 2-bit four-value data, for example.

A memory cell array 1 includes a plurality of bit lines and word lines and a common source line. For example, an electrically rewritable memory cell comprising an EEPROM is arrayed like a matrix. The memory cell array 1 is connected with a bit control circuit 2 for controlling a bit line and a word line control circuit 6.

The bit line control circuit 2 makes the following operations via the bit line. Specifically, the circuit 2 reads the data of a memory cell of the memory cell array 1. The circuit 2 detects a state of the memory cell of the memory cell array. The circuit further applies a write control voltage to the memory cell of the memory cell array. The bit line control circuit 2 is further connected with a column decoder 3 and a data input/output buffer 4. A data storage circuit included in the bit line control circuit 2 is selected by the column decoder 3. Data of the memory cell read by the data storage circuit is output externally from a data input/output terminal 5 via the data input/output buffer 4. Externally supplied various commands CMD for controlling the operation of the NAND flash memory, address ADD and data DT are input to the data input/output terminal 5. Write data input to the data input/output terminal 5 is supplied to the data storage circuit selected by the column decoder 3. The foregoing command and address are supplied to a control signal and control voltage generation circuit 7 via the buffer 4.

The word line control circuit 6 is connected to the memory cell array 1. The word line control circuit 6 selects a word line included in the memory cell array 1. Then, the circuit 6 applies voltage required for read, write or erase to the selected word line.

The foregoing memory cell array 1, bit line control circuit 2, column decoder 3, data input/output buffer and word line control circuit 6 are connected to the control signal and control voltage generation circuit 7, and controlled by the circuit 7. The control signal and control voltage generation circuit 7 is connected to a control signal input terminal 8. The circuit 7 is controlled by the following control signals: address latch enable (ALE), command latch enable (CLE), write enable (WE) and read enable (RE) externally input via the control signal input terminal 8.

The foregoing bit line control circuit 2, column decoder 3, word line control circuit 6 and control signal and control voltage generation circuit 7 form a write circuit and a read circuit.

FIG. 3 shows each configuration of the memory cell array 1 and the bit line control circuit 2 shown in FIG. 2. The memory cell array 1 has a plurality of NAND cells arrayed. One NAND cell is composed of a memory cell MC, select gates S1 and S2. For example, the memory cell MC comprises 32 EEPROMs connected in series. The select gate S2 is connected to a bit line BL0e while the select gate S1 is connected to a source line SRC. A control gate of the memory cell MC arrayed in each row is commonly connected to word lines WL0 to WL29, WL30 and WL31. The select gate S2 is commonly connected to a select line SGD while the select gate S1 is commonly connected to a select line SGS.

The bit line control circuit 2 has a plurality of data storage circuits 10. Each of the data storage circuits 10 is connected with a pair of bit lines (BL0e, BL0o), (BL1e, BL1o) . . . (BLie, BLio), (BL8ke, BL8ko).

The memory cell array 1 includes a plurality of blocks shown by a broken line. Each block comprises a plurality of NAND cells. For example, data is erased at a unit of the block. An erase operation is made simultaneously with respect to two bit lines connected to the data storage circuit 10.

A plurality of memory cells (in arrange surrounded by a broken line) form one sector. These memory cells are alternately arrayed and connected to one word line. Data is written and read out every sector. In other words, half of the memory cells arrayed in the row direction are connected to the corresponding bit line. Thus, write or read operation is carried out with respect to the foregoing half of the memory cells arrayed in the row direction.

In read, program verify and program operations, one of two bit lines (BLie, BLio) connected to the data storage circuit 10 is selected in accordance with address signals (YA0, YA1, . . . YAi . . . YA8k) supplied externally. In accordance with the external address, one word line is selected, and thus, a second page shown by a broken line is selected. The changeover to the second page is made according to the address.

FIG. 4 shows another configuration of the foregoing memory cell array 1 and bit line control circuit 2 shown in FIG. 2. According to the configuration shown FIG. 3, the data storage circuit 10 is connected with two bit lines (BLie, BLio). On the contrary, according to the configuration shown in FIG. 4, each bit line is connected with the data storage circuit 10. The memory cells arrayed in the row direction are all connected to the corresponding bit line. Thus, a write or read operation is carried out with respect to all memory cells arrayed in the row direction.

In the following description, both of the configurations shown in FIGS. 3 and 4 are applicable. Here, the case of using the configuration shown in FIG. 3 will be hereinafter described.

FIGS. 5A and 5B are cross-sectional views showing a memory cell and a select transistor. FIG. 5A shows a memory cell. A substrate 51 (P-well region 55 described later) is formed with an n diffusion layer 42 functioning as source and drain of the memory cell. A floating gate (FG) 44 is formed on the P-well region 55 via a gate insulating film 43. A control gate (CG) 46 is formed on the floating gate 44 via a gate insulating film 45. FIG. 5B shows a select gate. The P-well region 55 is formed with an n diffusion layer 47 functioning as source and drain. A control gate 49 is formed on the P-well region 55 via a gate insulating film 48.

Figure 6:
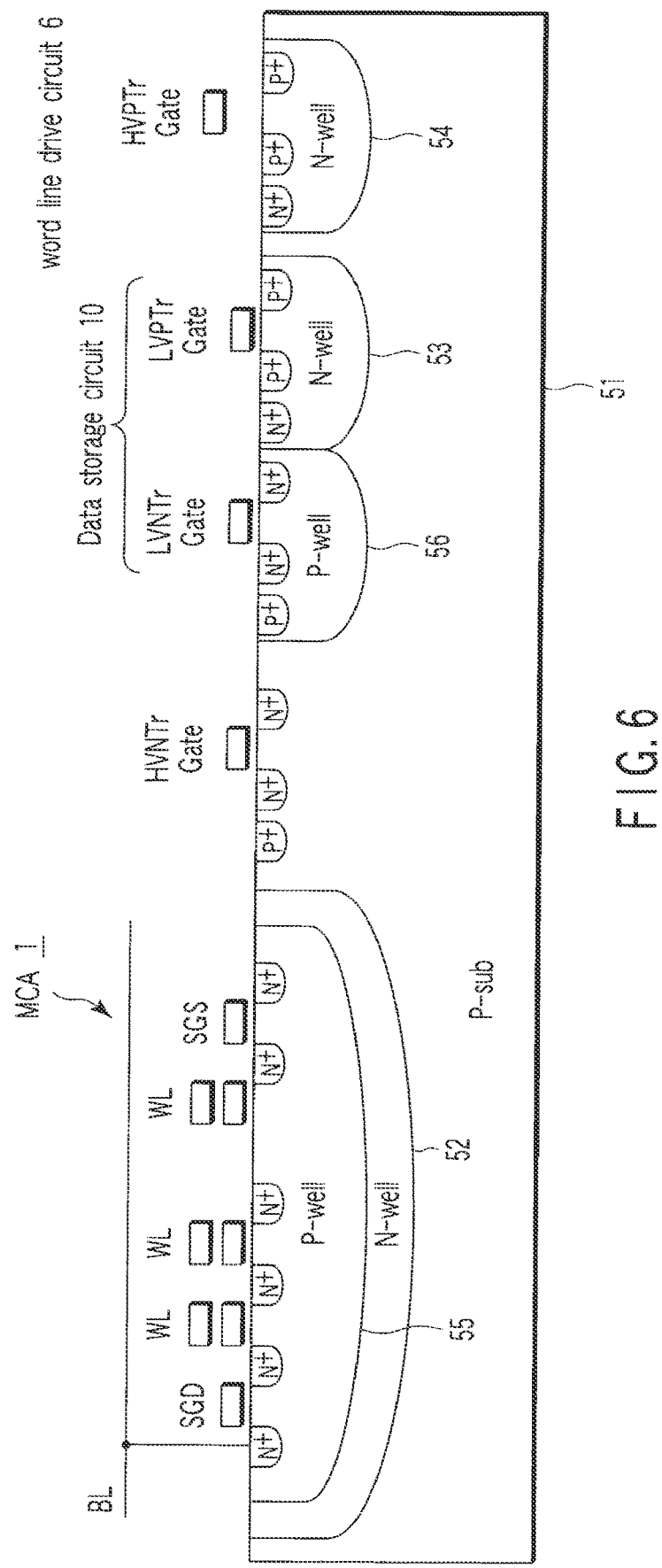
FIG. 6 is a cross-sectional view showing a NAND flash memory.

FIG. 6 is a cross-sectional view showing a NAND flash memory. For example, a P-type semiconductor substrate 51 is formed with N-well regions 52, 53, 54 and a P-well region. The P-well region is formed in the N-well region 52. A memory cell Tr forming the memory cell array is formed in the P-well region 55. Low-voltage P-channel transistor LVPTr and low-voltage N-channel transistor LVNTr forming the data storage circuit 10 are formed in the N-well region 53 and the P-well region 56, respectively. A high-voltage N-channel transistor HVNTr connecting the bit line and the data storage circuit 10 is formed in the substrate 51. A high-voltage P-channel transistor HVPTr forming a word line drive circuit is formed in the N-well region 54. As seen from FIG. 5, high-voltage transistors HVNTr and HVPTr have a gate insulating film thicker than low-voltage transistors LVNTr and LVPTr.

FIG. 7 is a table showing a voltage supplied to each region shown in FIG. 6. In erase, program, and read operations, a voltage shown in FIG. 7 is supplied to each region. In FIG. 7, Vera is a voltage applied to the substrate when data is erased. Vss is a ground voltage, and Vdd is a power supply voltage. Vpgmh is a voltage Vpgm+Vth supplied to the word line when data is written. Vreadh is a voltage Vread+Vth supplied to the word line when data is read.

FIG. 8 is a circuit diagram showing the configuration of the data storage circuit 10 shown in FIG. 3.

The data storage circuit 10 has a primary data cache (PDC), secondary data cache (SDC), dynamic data cache (DDC) and temporary data cache (TDC). The foregoing SDC, PDC and DDC hold input data in a write operation, and hold in a read operation, and further, temporarily hold data in a verily operation. Moreover, these caches are used to handle internal data when multi-value data is stored. The TDC amplifies data of the bit line when data is read, and temporarily holds it, and further, is used to handle internal data when multi-value data is stored.

The SDC is composed of clocked inverters 61a, 61b forming a latch, transistors 61c and 61d. The transistor 61c is connected between an input terminal of the clocked inverter 61a and an input terminal of the clocked inverter 61b. A gate of the transistor 61c is supplied with a signal EQ2. The transistor 61d is connected between an output terminal of the clocked inverter 61 and ground. A gate of the transistor 61d is supplied with a signal PRST. A node N2a of the SDC is connected to an input/output data line IO via a column select transistor 61e. A node N2b of the SDC is connected to an input/output data line Ion via a column transistor 61f. Each gate of these transistors 61e and 61f is supplied with a column select signal CSLi. The node N2a of the SDC is connected to a node N1a of the PDC via transistors 61g and 61h. A gate of the transistor 61g is supplied with a signal BLC2 while a gate of the transistor 61h is supplied with a signal BLC1.

The PDC is composed of clocked inverters 61i, 61j and transistor 61k. The transistor 61k is connected between an input terminal of the clocked inverter 61i and an input terminal of the clocked inverter 61j. A gate of the transistor 61k is supplied with a signal EQ1. A node N1b of the PDC is connected to a gate of a transistor 61l. One terminal of a current path of the transistor 61l is grounded via a transistor 61m. A gate of the transistor 61m is supplied with a signal CHK1. The other terminal of the current path of the transistor 61l is connected to one terminal of a current path of transistors 61n and 61o forming a transfer gate. A gate of the transistor 61n is supplied with a signal CHK2n. A gate of the transistor 61o is connected to an output terminal of the clocked inverter 61a. The other terminal of the current path of the transistors 61n and 61o is connected with an interconnect COMi. The interconnect COMi is an interconnect common to all data storage circuits 10. When verify of all data storage circuit 10 is completed, the potential of the interconnect COMi goes high. Namely, when verify is completed, a node N1b of the PDC goes low, as described later. In this state, when the signals CHK1 and CHK2 are made high, if verify is completed, the potential of the interconnect COMi goes high.

The TDC comprises a MOS capacitor 61p, for example. The capacitor 61p is connected between a connection node N3 of the transistors 61g, 61h and ground. The connection node N3 is further connected with the DDC via a transistor 61q. A gate of the transistor 61q is supplied with a signal REG.

The DDC is composed of transistors 61r and 61s. One terminal of a current path of the transistor 61r is supplied with a signal VREG while the other terminal thereof is connected to a current path of the transistor 61q. A gate of the transistor 61r is connected to the node N1a of the PDC via the transistor 61s. A gate of the transistor 61s is supplied with a signal DTG.

The connection node N3 is further connected with one terminal of a current path of transistors 61t and 61u. The other terminal of the current path of the transistor 61u is supplied with a signal BLCLAMP. The other terminal of the current path of the transistor 61t is connected to one terminal of the bit line BLo via a transistor 61v, and connected to one terminal of the bit line BLe via a transistor 61w. The other terminal of the bit line BLo is connected to one terminal of a current path of a transistor 61x. A gate of the transistor 61x is supplied with a signal BIASo. The other terminal of the bit line BLe is connected to one terminal of a current path of a transistor 61y. A gate of the transistor 61y is supplied with a signal BIASe. The other terminal of a current path of these transistors 61x and 61y is supplied with a signal BLCRL. Transistors 61x and 61y are turned on complementarily to transistors 61v and 61w in accordance with signals BIASo and BIASe to supply a potential of the signal BLCRL to a non-select bit line.

The foregoing signals and voltages are generated by the control signal and control voltage generation circuit 7 shown in FIG. 3. The following operation is controlled based on the control by the control signal and control voltage generation circuit 7.

The data storage circuit 10 shown FIG. 4 has the same configuration as shown in FIG. 8. In this case, connection with the bit line is different only. Specifically, the other terminal of the transistor 61*t* is connected with the transistor 61*v* only, and connected to bit lines BLe or BLo via the transistor 61*v*.

The present memory is a multi-value memory, and stores two-bit data in one cell. Changeover to two-bit is made according to address (first page, second page). If two bits are stored in one cell, two pages are required. If three bits are stored in one cell, changeover is made according to address (first page, second page, third page). If four bits are stored in one cell, changeover is made according to address (first page, second page, third page, fourth page).

Figure 9A:
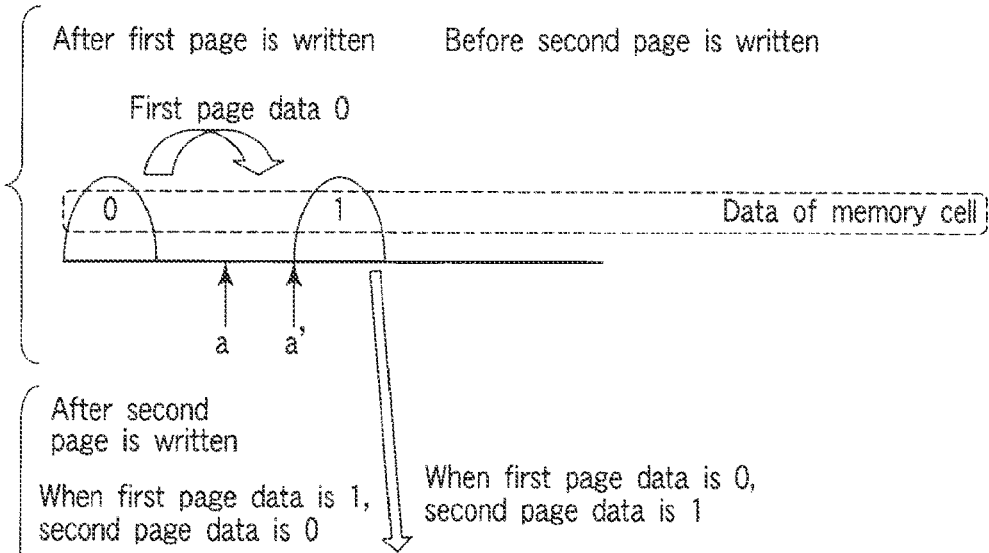
FIGS. 9A, 9B and 9C are views showing memory cell threshold voltage distribution with write and erase operations.
Figure 9B:
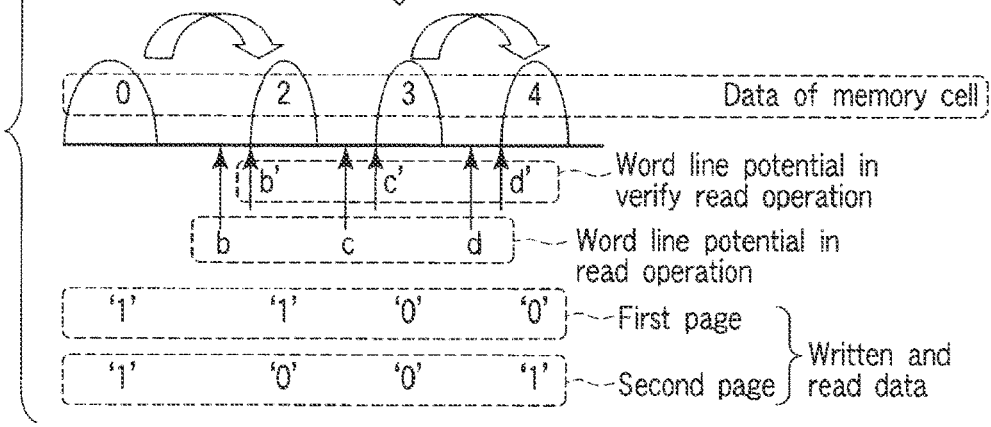
Figure 9C:
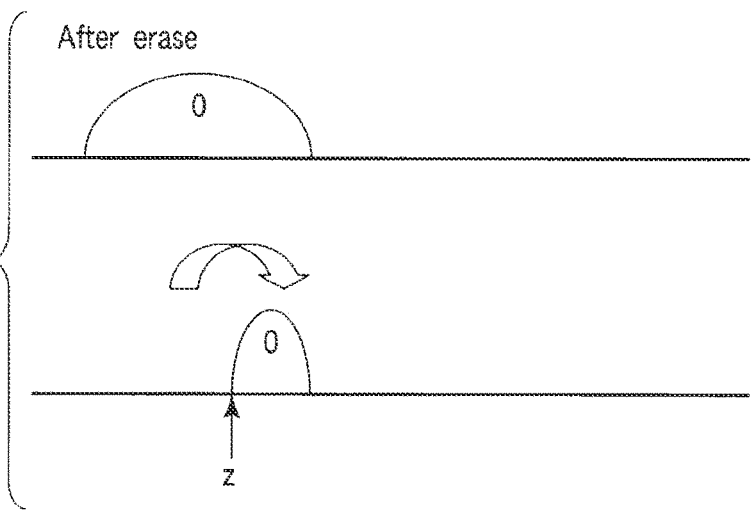

FIGS. 9A, 9B and 9C show the relationship between data and threshold voltage when two-bit data is stored in a memory cell. When an erase operation is made, the data of the memory cell becomes "0" as seen from FIG. 9C. After erase is made, write is made using a verify level "z" to narrow down a spread of the threshold distribution. The data "0" is set as negative threshold voltage distribution.

As shown in FIG. 9A, if write data is "1" in first page write, memory cell data is still "0". If the write data is "0", the memory cell data becomes "1".

As depicted in FIG. 9F, the second page is written, and thereafter, memory cell data is given as any of "0", "2", "3" and "4" in accordance with write data. Specifically, when memory cell data is "0" after the first page is written and the write data of the second page is "1", the memory cell data is still "0". When the write data is "0", memory cell data is "2". Moreover, when memory cell data is "1" after the first page is written and the write data is "0", memory cell data is "3". When write data is "1", memory cell data is "4". According to this embodiment, the memory cell data is defined as being changed from low threshold voltage to high threshold voltage. In this case, data "1", "2", "3" and "4" are a positive threshold voltage.

(Read Operation)

As seen from FIG. 9, the first page is written, and thereafter, memory cell data exists as data "0" or "1"; therefore, a read operation is made at a level "a". The second page is written, and thereafter, memory cell data exists as any of "0", "2", "3" and "4". Therefore, a read operation is made at any of levels "b", "c" and "d".

Figure 10:
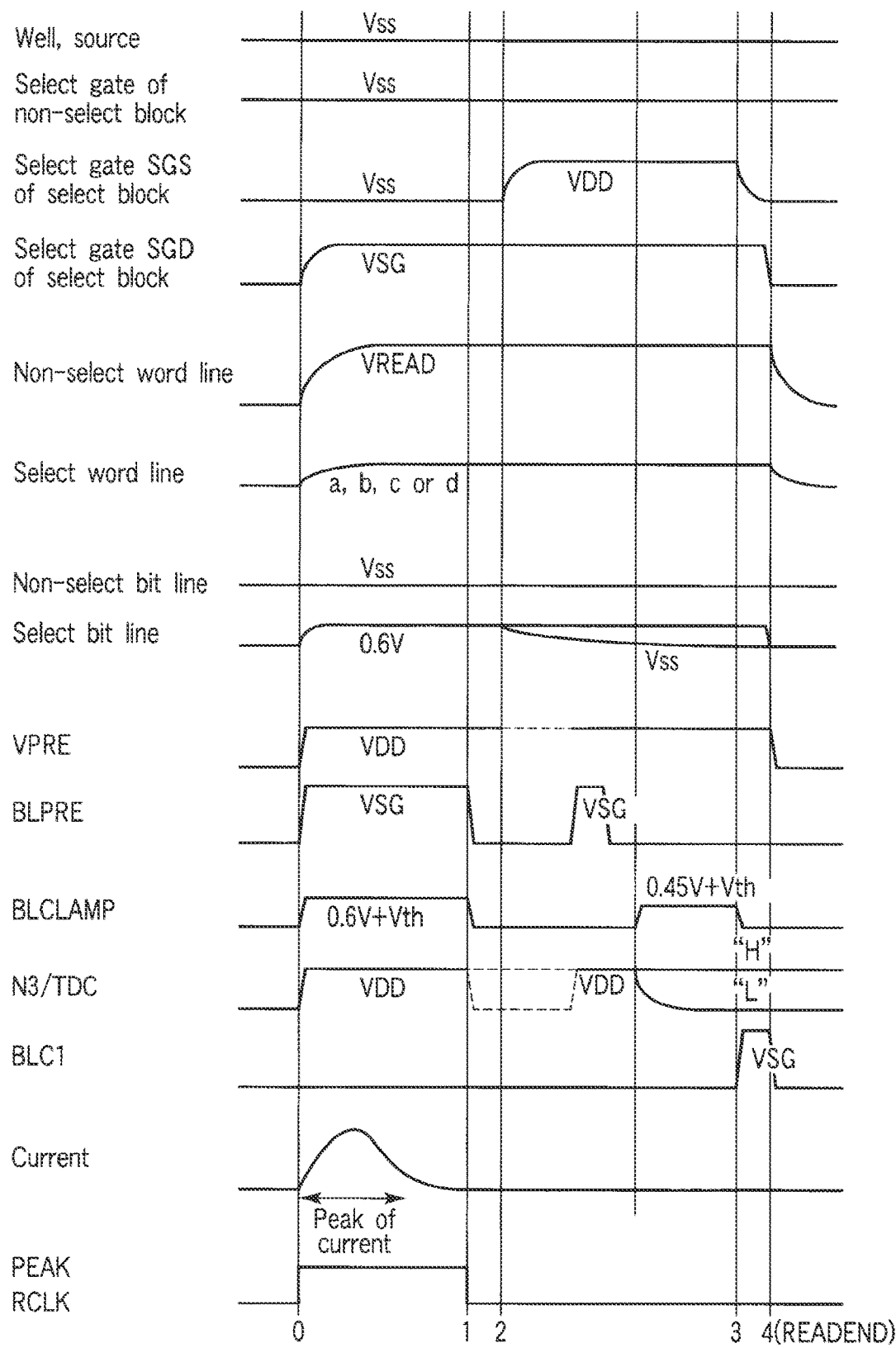
FIG. 10 is a view showing a waveform when read, verify operation is made.

FIG. 10 shows each waveform of read and read verify operations. In the read operation, well, source line and non-select bit line of the selected cell are set as 0V.

A potential "a" (e.g., "a"=0V), "b", "c2 or "d" in the read operation is applied to a select word line. Simultaneously, a non-select word line of a select block is set as Vread, and a select line SGD of the select block is set as Vsg (=Vdd+Vt). In this was, the select line SGS is set to Vss. Voltages Vdd (e.g., 2.5V), Vsg and (0.6V+Vth) are temporarily applied to VPRE, BLPPE and BLCLAMP of the data storage circuit shown in FIG. 8, respectively. In this way, the bit line is pre-charged to 0.6V, for example.

In this case, the select bit line is 0.6V, and the non-select bit line is Vss. Thus, if the capacitance of one bit line, non-select bit line, well and source is set as 4 pF, the capacitance Q of one bit line is obtained from the following equation Q=C×V, that is, Q=4 pF×0.6V. For example, if 8 kB is simultaneously written, the capacitance Q is obtained from the following equation Q=8×1024×8×4 pF×0.6V. For this reason, large peak current is generated as shown in FIG. 10.

The select line SGS on the source side of the cell is set as Vsg (=Vdd+Vth). When the threshold voltage is higher than "a" or "b", "c" and "d", the cell turns off. Thus, the bit line is still high (e.g., 0.6V). When the threshold voltage is lower than "a" or "b", "c" and "d", the cell turns on. Thus, the bit line is discharged to become the same potential as the source, that is, Vss.

The signal BLPRE of the data storage circuit shown in FIG. 8 is temporarily set to Vsg (=Vdd+Vth) to pre-charge the node of the TDC to Vdd. Thereafter, the signal BLCLAMP is supplied with a voltage (0.45+Vth), for example. When the bit line is lower than 0.45V, the node of the TDC goes low. Conversely, when the bit line is higher than 0.45V the node of the TDC is still high. In FIG. 10, the signal BLC1 is set to Vsg (=Vdd+Vth) so that the PDC reads the potential of the TDC. Therefore, if the threshold voltage of the cell is lower than level "a" or "b", "c" and "d", the PDC goes low. Conversely, the threshold voltage is higher than above, the PDC goes high, and thus, read is made.

As shown in FIG. 4, when all cells array in the row direction are collectively read, the select line SGS of the select block is made high together with the select line SGD of the select block. Thus, when the bit line is charged, and simultaneously, the cell is on, the bit line is discharged. Conversely, when the cell is off, the bit line is held at a charging state. The bit line level is read to the PDC via the TDC. Therefore, if the number of on-state cells is much, large current flows through the source line from the node supplied with the signal VPRE. As a result, there is a problem that the potential of the source line is a floating state. In order to solve the problem, a read operation is made several times. When the cell turns on, that is, the cell through which current flows determines the read result as low level not to charge the bit line from the next time. In the first-time read, read is again made with respect to the cell, which is read at high level. Therefore, large peak current is generated in the first-time read.

(Program and Program Verify)

(Program)

Figure 11:
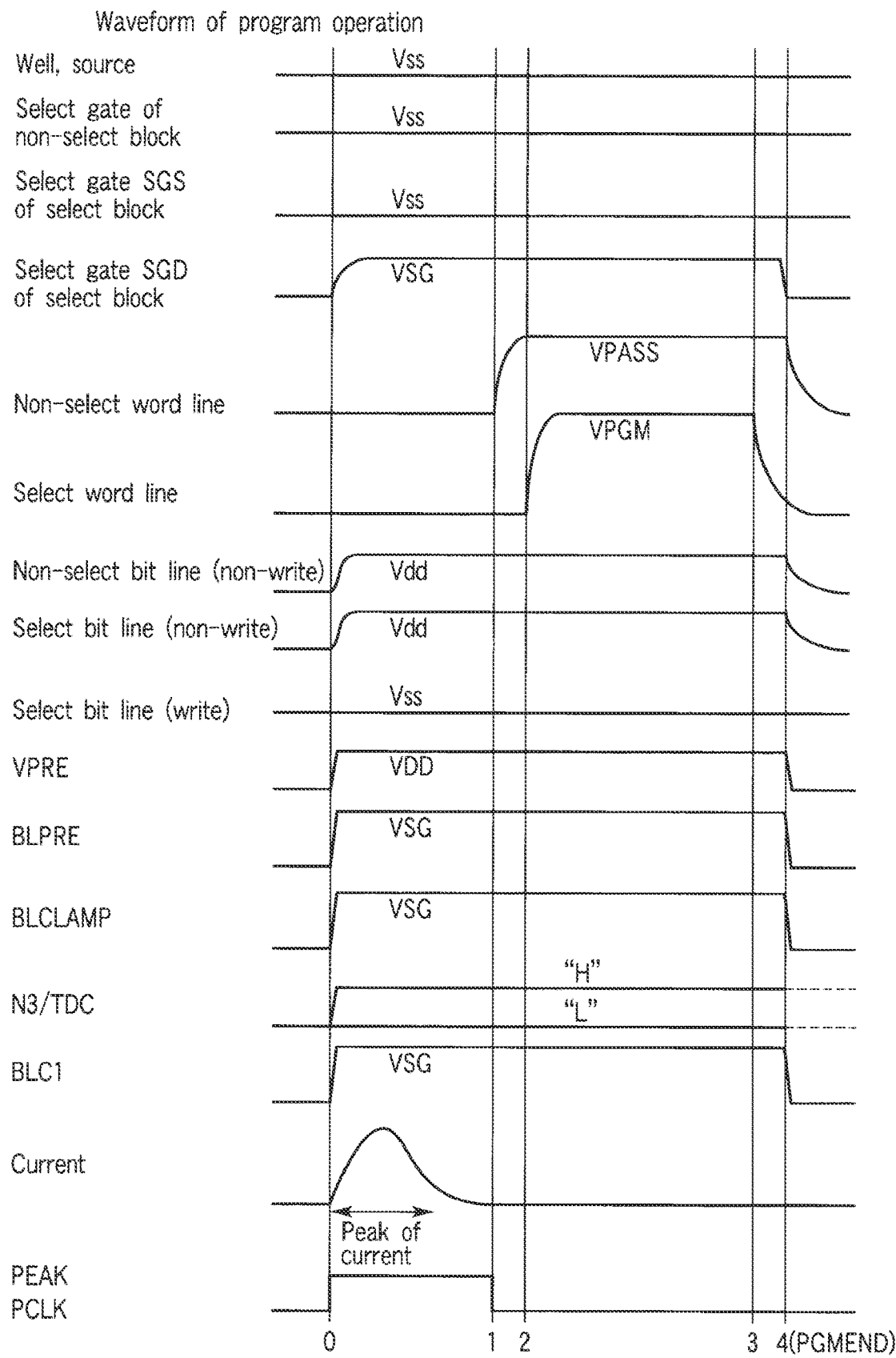
FIG. 11 is a view showing a waveform when a program operation is made.
Figure 13:
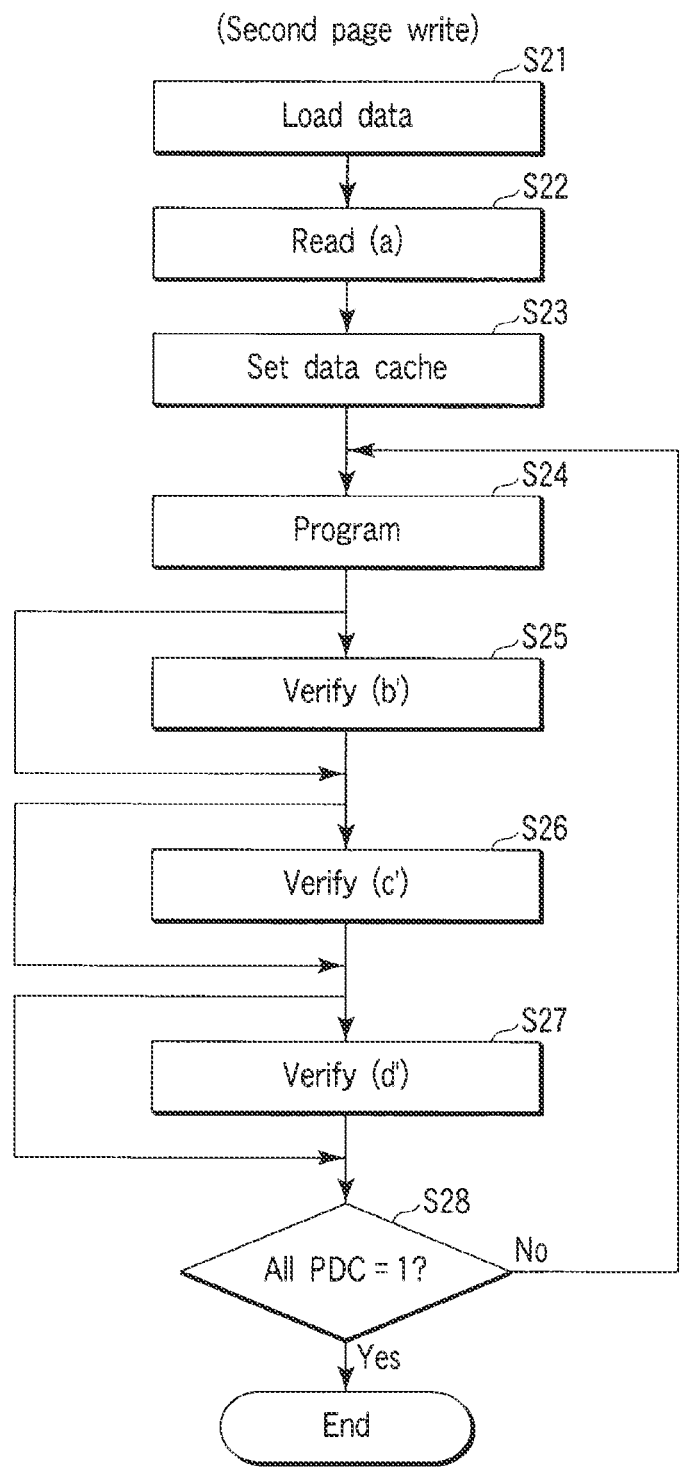
FIG. 13 is a flowchart to explain a second-page write operation.

FIG. 11 shows a waveform of a program operation. FIG. 12 is a flowchart showing a first page program operation. FIG. 13 is a flowchart showing a second page program operation. The program operation will be schematically described with reference to FIGS. 12 and 13.

According to the program operation, address is designated, and then, two pages shown in FIG. 3 are selected. In this memory, of two pages, program is made in the order of first page and second page. Therefore, the first page is selected at first.

Write data is externally input, and then, stored in the SDC of all data storage circuits 10 (step S11). When a write command is input, data of the SDC of all data storage circuits 10 is transferred to the PDC (step S12). When data "1" (no write is made) is externally input, the node N1*a* of the PDC goes high. Conversely, when data "0" (write is made) is input, the node N1*a* goes low. Thereafter, the data of the PDC is set as the potential of the node N1*a* of the data storage circuit 10. On the other hand, the data of the SDC is set as the potential of the node N2*a* of the data storage circuit 10.

(Program Operation)

The signal BLC1 of the data storage circuit shown in FIG. 8 is set to a voltage Vdd+Vth. Thus, when the PDC stores data "1" (no write is made), the bit line is Vdd. Conversely, when the PDC stores data "0" (write is made), the bit line is Vss. Write must not be made with respect to cells (bit line is non-select) of the non-select page connected to the selected word line. Thus, bit lines connected to these cells are set to Vdd.

In this case, when write is made with respect to the select bit line (Vss), the non-select bit line is non-write (Vdd). The capacitance of one select bit line, non-select bit line well and source is set as 4 pF, for example. A charge Q of one bit line is obtained from the following equation Q=C(4 pF)×V (2.5V). For example, if 8 kB memory cells are simultaneously written, the charge Q is obtained from the following equation Q(8 kB)=8×1024×8×c(4 pF)×V(2.5V). Therefore, large peak current is generated.

As depicted in FIG. 4, when all memory cells arrayed in the row direction are collectively written, all bit lines are a selected state. In particular, when data "1" and data "0" are alternately given as write data for example, the capacitance between all bit lines becomes the maximum. Therefore, large peak current is generated.

Vdd is applied to the select line SGD of the selected block, and a write voltage VPGM (20V) is applied to the select word line, and further, VPASS (10V) is applied to the non-select line. The foregoing voltage is applied, and thereby, when the bit line is Vss, a channel of the cell is Vss, and the word line is VPGM; therefore, write is carried out. On the other hand, when the bit line is Vdd, the channel of the cell is Vdd, and not Vss. Thus, voltage is about VPGM/2 according to coupling; for this reason, the memory cell is not programmed.

In the first page write (FIG. 12, S11 to S15), memory cell data becomes data "0" and data "1". After the second page write (FIG. 13, S21 to S28), memory cell data becomes data "0", "2", "3" and "4".

(Program Verify Read)

The memory cell is written in the order of the level that threshold voltage is low. Thus, first page program verify is verified at a level "a'", and second page program verify is verified at a level "b'", "c'" or "d'" (S25 to S27). The program verify operation is almost the same as the foregoing read operation.

Well, source line and non-select bit line of the selected cell is set to Vss. A potential "a'", "b'", "c'" or "d'" (e.g., "a"=0V, "a'"=0.5V) slightly higher than the potential "a" in the read operation is applied to the select word line. Hereinafter, the symbol "'" shows a verify voltage, and has a value slight higher than the read potential.

The signal VPRE of the data storage circuit 10 shown in FIG. 8 is set to Vdd (e.g., 2.5V). The signal BLPRE is set to Vsg (=Vdd+Vth). The signal BLCLAMP is set to (0.6V+Vth). In this way, the bit line is pre-charged to 0.6V. The select line SGS on the source side of the cell is set to Vsg (=Vdd+Vth). Well and source line are Vss. Thus, when the threshold voltage is higher than "a'", "b'", "c'" or "d'", the cell turns off. Thus, the bit line is still high (e.g., 2.2V). Conversely, when the threshold voltage is lower than "a'", "b'", "c'" or "d'", the cell turns on. Thus, the bit line is discharged, and then, set as Vss. While the bit line discharges, the signal VPRE as set to Vss, and the signal BLPRE is set to Vdd. Then, the TDC is set to Vss, the signal REG is made high, and further, the signal VREG is made high. In this way, the data of the DDC is moved to the TDC. Thereafter, the signal DTG is temporarily set to Vsg (=Vdd+Vth), the data of the PDC is copied to the DDC. The signal BLC1 is made high so that the data of the TDC is moved to the PDC. Via the foregoing operation, data showing write or non-write stored in the PDC is transferred to the DDC, and then, the data of the DDC is transferred to the PDC.

The signal BLPRE is temporarily set to Vsg (=Vdd+Vth) to pre-charge the node N3 of the TDC to Vdd. Thereafter, the signal BLCLAMP is set to (0.45V+Vth), for example. The node N3 of the TDC goes low when the bit line is lower than 0.45V. Conversely, when the bit line is higher than 0.45V, the node N3 is still high. The signal BLC1 is set to Vsg (=Vdd+Vth) to read the potential of the TDC. Then, the signal VREG is set to Vdd, and the signal REG is set to Vsg (=Vdd+Vth). In this way, when the DDC is high (non-write), the TDC is forcibly made high. However, when the DCC is low (write), the value of the TDC has no change. Here, the signal DTG is set to Vsg (=Vdd+Vth) so that the data of the PDC is transferred to the DDC. Thereafter, the signal BLC1 is set to Vsg (=Vdd+Vth) to read the potential of the TDC to the PDC. Therefore, when the PDC is inherently low (write) and the threshold voltage of the cell is lower than level "a'", "b'", "c'" or "d'", the PDC again goes low (write). Conversely, when the threshold voltage of the cell is higher than level "a'", "b'", "c'" or "d'", the PDC goes high, and is set as non-write from the next program. When the PDC is inherently high (non-write), the PDC goes high, and is set as non-write from the next program.

In the second page write, according to the level "b'" program verify, when the foregoing operation is made, write cell to level "c'" and "d'" is set as non-write by the level "b'" program verify. For example, in the case of level "c'" and "d'" write, the node N2a of the data storage circuit shown in FIG. 8 is made low. In the case of level "b'" write, the node N2a is made high. In this state, the signal REG is set to Vsg. In the case of non-write, the signal BLC2 is set to Vtr (=0.1V+Vth) before an operation of forcibly making the TDC high. In the case of level "c'" and "d'" write, the TDC is forcibly made low so that write is not completed in the level "b'" program verify.

Moreover, in the second page write, according to the level "c'" program verify, when the foregoing operation is made, write cell to level "d'" is set as non-write by the level "c'" program verify. For example, in the case of level "c'" write, the data of the DDC of the data storage circuit shown in FIG. 8 is previously made low. While the bit line discharges, an exchange between the data of the PDC and the data of the DDC is made. Thus, the signal BLC1 is set to Vtr (=0.1V+Vth) before an operation of forcibly making the TDC high. In the case of level "d'" write, the TDC is forcibly made low so that write is not completed in the level "d'" program verify.

When the PDC is low, a write operation is again made, and the program operation and the verify operation are repeated until the data of PDCs of all data storage circuits 10 become high.

As shown in FIG. 4, all memory cells arrayed in the row direction are collectively program-verified. In this case, data is read and verified from all memory cells like the case of collectively reading all memory cells arrayed in the row direction.

(Erase Operation)

An erase operation is made at a unit of the block shown by the broken line in FIGS. 3 and 4. After erase, the cell threshold voltage is the same memory cell data "0" as seen from FIG. 9C.

First Embodiment

FIG. 1 is a view schematically showing the configuration of an MCP or memory card using a NAND flash memory according to a first embodiment. In FIG. 1, for simplification of explanation, two NAND flash memory chips are built therein. In this case, chips more than two may be built in.

In FIG. 1, the MCP has first, second chips 71, 72 and controller 73. The first and second chips 71 and 72 include the NAND flash memory having the foregoing configuration. The controller 73 supplies chip enable signal CE (A), CE (B) to the first and second chips 71 and 12. The controller 73 further supplies a signal R/B showing Ready/busy, the foregoing signals ALE, CLE, WE, RE, address signal and data. The controller 73 receives the data read from the first and second chips 71 and 72, and outputs externally.

The foregoing first, second chips 71, 72 and controller 73 each have a monitor circuit MNT. The monitor circuit MNT monitors whether or not the first, second chips 71, 72 and controller 73 use current (peak current) larger than a reference current.

Each of the monitor circuits of the foregoing first, second chips 71, 72 and controller 73 has the same configuration. For example, the monitor circuit MNT of the first chip 71 is composed of an N-channel MOS transistors 74-1 and an inverter 75-1. Likewise, the monitor circuit MNT of the second chip 72 is composed of an N-channel MOS transistor 74-2 and inverter 75-2. The monitor circuit MNT of the controller 73 is composed of an N-channel MOS transistor 74-3 and an inverter 75-3. Each drain of transistors 74-1, 74-2 and 74-3 is connected to a resistor 76 included in the controller 73 via a communication line ML, and further, connected to power supply VDD via the resistor. Each source of transistors 74-1, 74-2 and 74-3 is grounded. Each gate of transistors 74-1, 74-2 and 74-3 is supplied with a peak signal PEAK generated in each if the first, second chips 71, 72 and controller 73. Each input terminal of the inverters 75-1, 75-2 and 75-3 is connected to each drain of the transistors 74-1, 74-2 and 74-3. Each output terminal of the inverters 75-1, 75-2 and 75-3 is connected to each internal circuit of the first, second chips 71, 72 and controller 73 described later.

Incidentally, a diode-connected N-channel depletion-type MOS transistor 77 may be used in place of the resistor 76.

Any or both of the first and second chips are provided with the resistor 76 without connecting to each drain of the transistors 74-1 and 74-2 to the controller 73. In this way, power is supplied to transistors 74-1 and 74-2 every first and second chips, and power is supplied to the second or first chip from the first or second chip.

As illustrated in FIG. 24, the following configuration may be employed. For example, a peak signal PEAK generated in the first chip 71 is inverted by an inverter 71-1 to be directly supplied to an input terminal of an inverter 72-1 generating a monitor signal MOUT of the second chip 72. A peak signal PEAK generated in the second chip 72 is inverted by an inverter 72-2 to be directly supplied to an input terminal of an inverter 71-2 generating a monitor signal MOUT of the first chip 71. In this case, a first peak recognition signal is supplied from the first chip 71 to the second chip 72 while a second peak recognition signal is supplied from the second chip 72 to the first chip 71. Thus, two communication lines are required to make a connection between the first and second chips 71 and 72.

The peak signal PEAK is a signal generated at peak current generation timing in the first, second chips 71, 72 and controller 73, as described later. In other words, the peak signal PEAK is generated at timing when large current such as write (program), verify read, read and erase is generated in the first and second chips 71 and 72.

The controller 73 further has an error correction circuit 78. When the error correction circuit 78 is operated, large current is generated. Thus, when the read data is output, the peak signal PEAK is generated at timing when the error correction circuit 78 is operated.

If no peak current is generated, the peak signal PEAK is non-active (low). The potential (peak recognition signal) of each drain of the transistors 74-1, 74-2 and 74-3 is made high. The monitor signal MOUT output from each output terminal of the inverters 75-1, 75-2 and 75-3 is made high. In this state, the first chip 71 attains a program state, and then, when the peak signal PEAK is generated, the transistor 74-1 turns on; as a result, the communication line ML goes low. Thus, each monitor signal MOUT output from the output terminals of the inverters 75-1, 75-2 and 75-3 of the first, second chips 71, 72 and controller 73 goes high. When the monitor signal MOUT goes high, the second chip 72 and the controller 73 are in a wait state. Therefore, the second chip 72 and the controller 73 serves to prevent large current from being generated.

Figure 14:
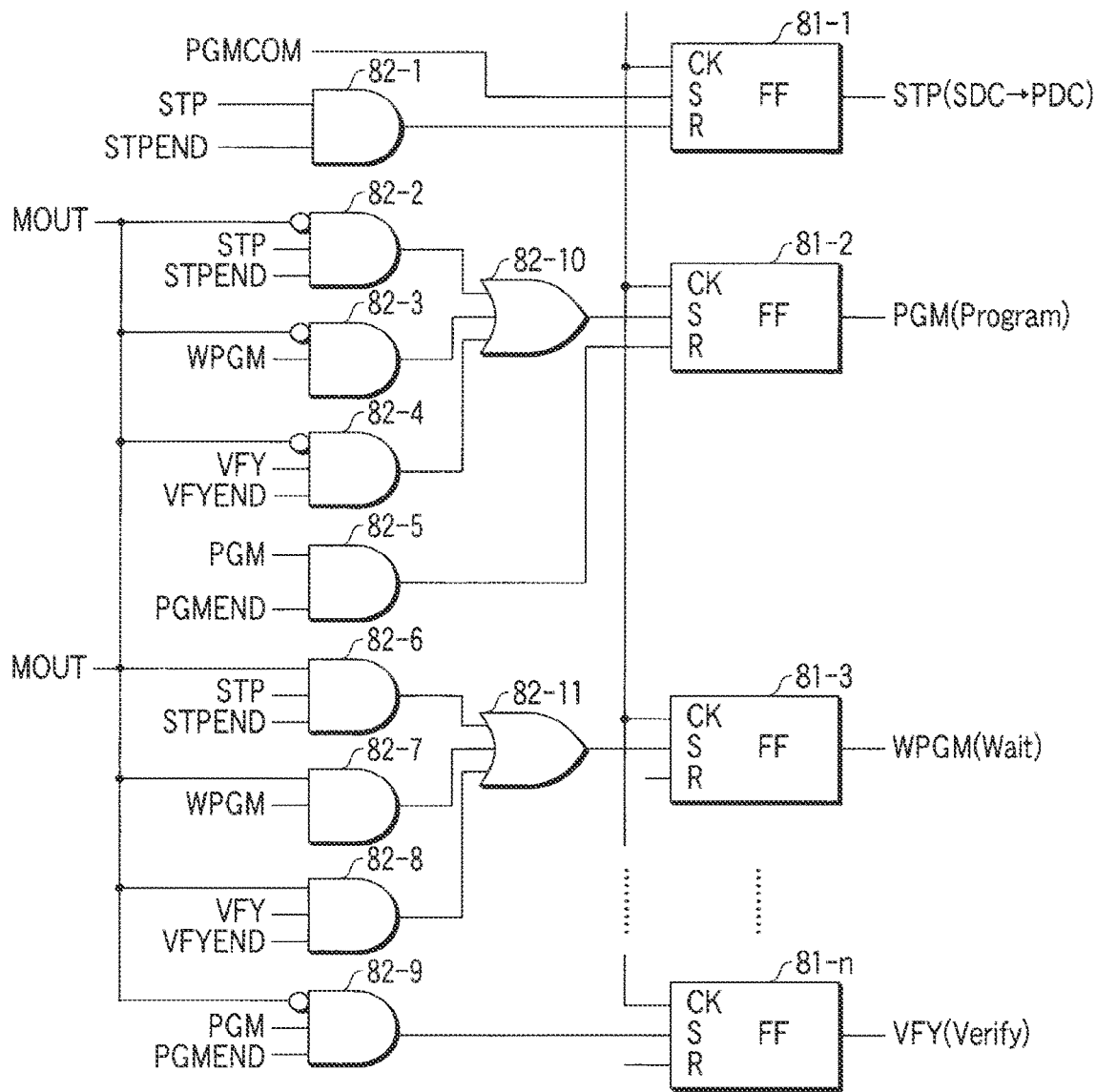
FIG. 14 is a circuit diagram showing the configuration of a sequence controller.

FIG. 14 shows the configuration of a sequence controller of the first and second chips 71 and 72. The sequence controller is provided in the control signal and control voltage generation circuit 7 shown in FIG. 2.

As seen from FIG. 14, the sequence controller is composed of a plurality of flip-flops 81-1 to 81-$n$, AND gates 82-1 to 82-9, OR gates 82-10 and 82-11. Each of flip-flops 81-1 to 81-$n$ sequentially holds each step state of write operations shown in FIGS. 11 and 12. Specifically, the flip-flop 81-1 is set when data is transferred from the SDC to the PDC in accordance with a program command PGMCOM. The flip-flop 81-2 is set to a program start state after data is transferred from the SDC to the PDC. The flip-flop 81-3 is set to a program wait state. The flip-flop 81-$n$ is set to a verify start state after the program ends.

An input terminal of the AND gate 82-1 is supplied with a signal output from the flip-flop 81-1 and a signal STPEND indicative that data is transferred from the SDC to the PDC. The flip-flop 81-1 set according to the program command PGMCOM to output a signal STP, and then, reset according to an output signal of the AND gate 82-1.

Input terminals of AND gates 82-2 to 82-9 are supplied with the monitor signal MOUT output from the corresponding inverter of the inverters 75-1 and 75-2 forming the monitor circuit MNT included in the first and second chips 71 and 72.

Each input terminal of AND gate 82-2 and 82-6 is supplied with signals STP and STPEND. AND gates 82-3 and 82-7 receive a set output signal WPGM of the flip-flop 81-3. AND gates 81-4 and 82-8 are supplied with a signal VFY showing a verify state supplied from the flip-flop 81-$n$ and a signal VFYEND indicative that verify ends supplied from a flip-flop (not shown).

The OR gate 82-10 receives output signals from AND gates 82-2, 82-3 and 82-4 to set the flip-flop 81-2. As a result, the flip-flop 81-2 outputs a signal PGM showing a program state. The AND gate 82-5 receives a signal PGM output from the flip-flop 81-2 and a signal PGMEND indicative that program ends. Then, the AND gate 82-5 resets the flip-flop 81-2 at input timing of the signal PGMEND.

The OR gate 82-11 receives output signals from AND gates 82-6, 82-7 and 82-8 to set the flip-flop 81-3. As a result, the flip-flop 81-3 outputs a signal WPGM showing a program wait state.

The AND gate 82-9 receives a signal PGM output from the flip-flop 81-2 and a signal PGMEND indicative that program ends. The flip-flop 81-$n$ is set according to an output signal from the AND gate 82-9, and outputs a signal VFY showing a verify operation state.

Figure 15:
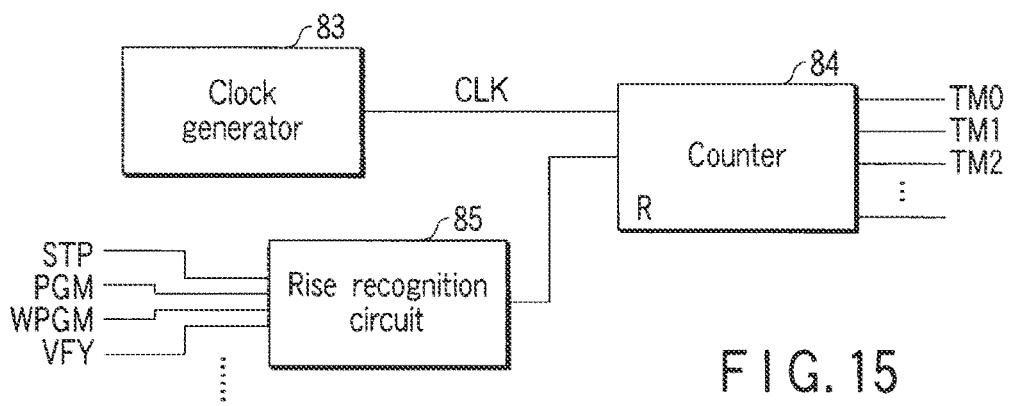
FIG. 15 is a circuit diagram showing the configuration of a timing signal generation circuit.
Figure 16:
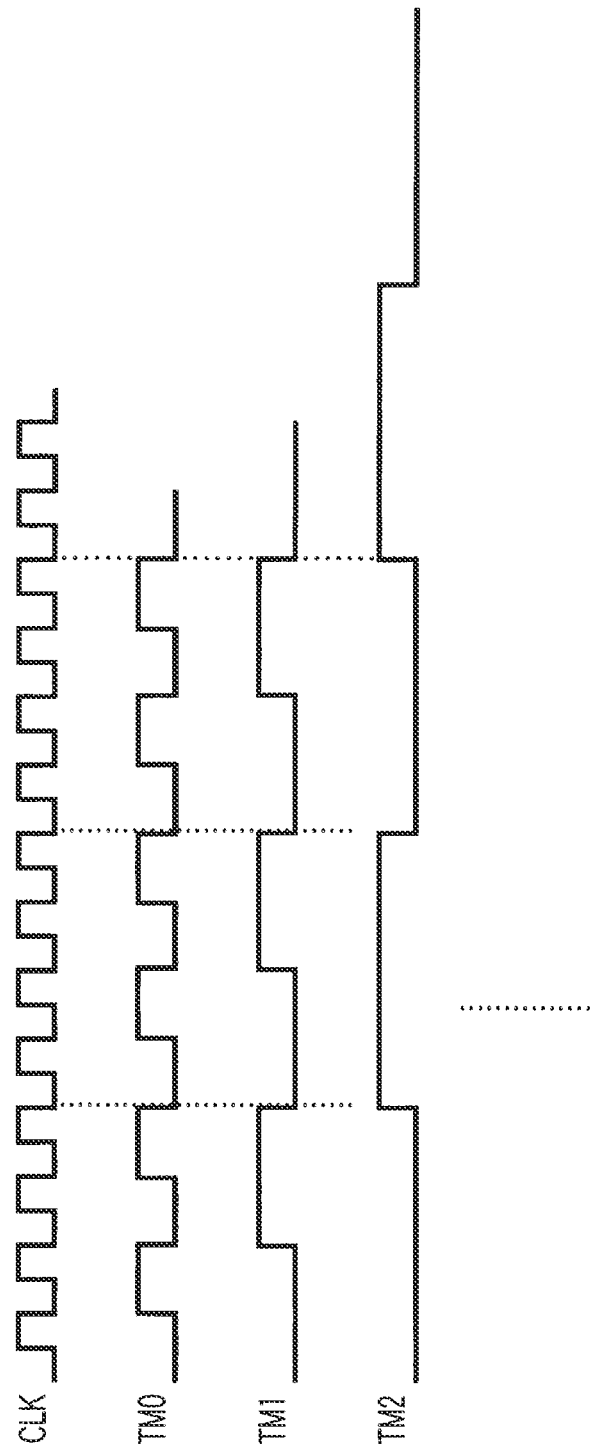
FIG. 16 is a waveform chart showing an output signal of the timing signal generation circuit.

FIG. 15 shows the configuration of a timing signal generation circuit. FIG. 16 shows output signals of the timing signal generation circuit.

In FIG. 15, a clock generator 83 generates a clock signal CLK. A counter clock signal output from the clock generator 83 is supplied to a counter 84. The counter 84 outputs counter timing signals TM0, TM1 . . . TMn shown in FIG. 16 according to the clock signal CLK. A rise recognition circuit 85 is supplied with output signals STP, PGM, WPGM, and VFY . . . from flip-flops 81-1 to 81-n. The rise recognition circuit 85 recognizes the rise of each signal, and outputs a reset signal. For example, the rise recognition circuit 85 outputs a reset signal just after PGM (program), VFY (verify) sequence comes in, and in this way, resets the counter 84.

Figure 17:
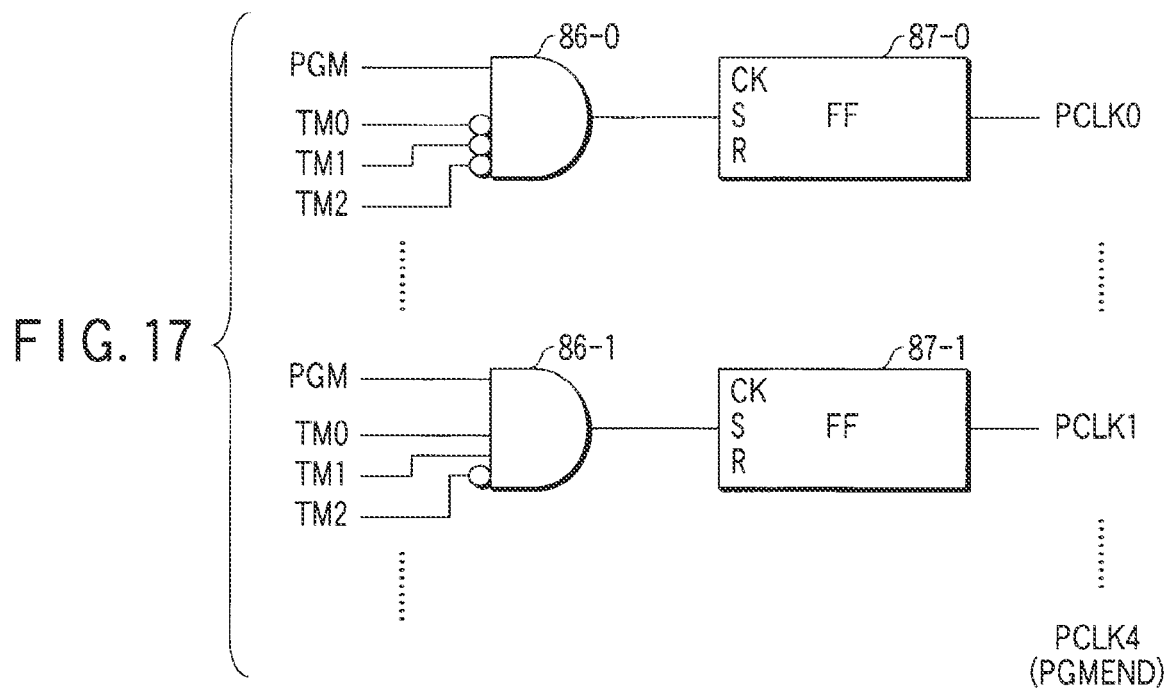
FIG. 17 is a circuit diagram showing another configuration of a timing signal generation circuit.

FIG. 17 shows the configuration of a timing signal generation circuit applied to the program operation shown in FIG. 11. The timing signal generation circuit is composed of a plurality of AND gates 86-0, 86-1 . . . and a plurality of flip-flops 87-0, 87-1 . . . . An input terminal of the AND gate 80-1 is supplied with the following signals. One is a signal PGM showing a counter program state supplied from the flip-flop 81-2 shown in FIG. 14. Another is inverted timing signals TM0, TM1 and TM2 supplied from the counter 84 shown in FIG. 15. An output signal of the AND gate 86-0 is supplied to a set input terminal of the flip-flop 87-0. The flip-flop 87-0 is set when the input conditions of timing signals TM0, TM1 and TM2 are satisfied in a program state, and thus, outputs a timing signal PCLK0. An input terminal of the AND gate 86-1 is supplied with the following signals. One is a signal PGM showing a program state, and another is timing signals TM0 and TM1 and inverted timing signal TM2. An output signal of the AND gate 86-1 is supplied to a set input terminal of the flip-flop 87-1. The flip-flop 87-1 is set when the input conditions of timing signals TM0, TM1 and TM2 are satisfied in a program state, and thus, outputs a timing signal PCLK1, while resets the timing signal PCLK0.

In FIG. 17, there are only shown circuits generating timing signals PLCK0 and PLCK1. In this case, circuits generating timing signals PLCK2 to PLCK4 (PGMEND) have the same configuration as above. Further, circuits generating timing signals PLCK0 to PLCK4 (READEND, VRYEND) applied to read and verify read operations shown in FIG. 10 have the same configuration as above.

Figure 18A:
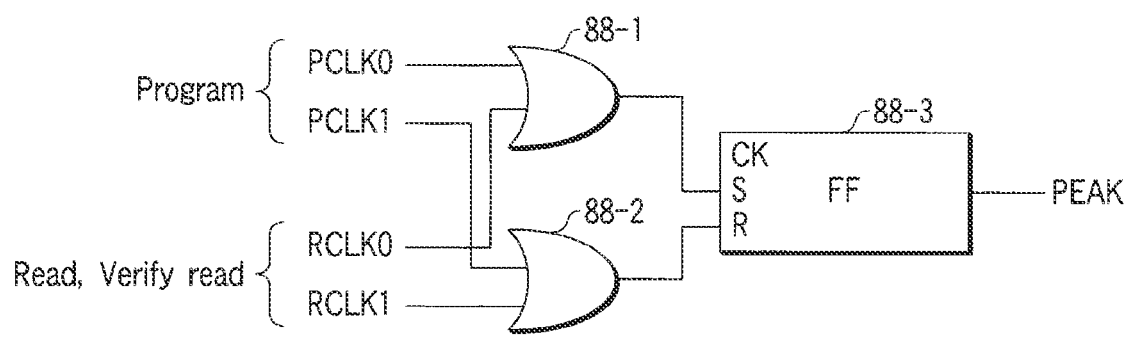
FIGS. 18A and 18B are circuit diagrams showing the configuration of a peak signal generation circuit.

FIG. 18A shows the configuration of a circuit, which included in each of the first and second chips 71 and 72 shown in FIG. 1, and generates a peak signal PEAK in program, read or verify read operation. For example, the circuit is composed of OR gates 88-1, 88-2 and a flip-flop 88-3. An input terminal of the OR gate 88-1 is supplied with timing signals PCLK0 and RCLK0. An input terminal of the OR gate 88-2 is supplied with timing signals PCLK1 and RCLK1. These timing signals RCKL0 and RCLK1 are timing signals generated like the forgoing program in read and verify read operation. An output terminal of the OR gate 88-1 is connected to a set input terminal of the flip-flop 88-3. An output terminal of she OR gate 88-2 is connected to a reset input terminal of the 88-3. A peak signal PEAK is output from an output terminal of the flip-flop 88-3. Specifically, as seen from FIGS. 10 and 11, the peak current is generated between timing signals RCLK0 and RCLK1 or between PCLK0 and PCLK1 in read, verify read or program operation. In other words, the circuit generating the peak signal PEAK generates a peak signal PEAK between timing signals RCLK0 and RCLK1 or between PCLK0 and PCLK1 in read, verify read or program operation.

Figure 18B:
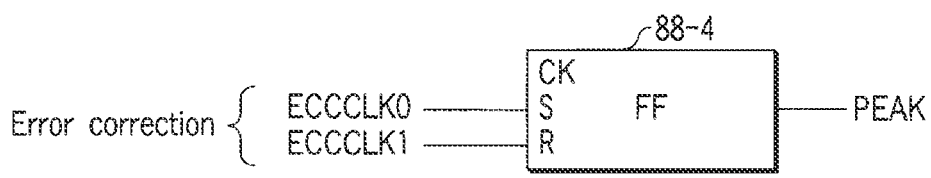

FIG. 18B shows the configuration of a peak signal generation circuit included in the foregoing controller 73. The circuit comprises a flip-flop 88-4. A set input terminal of the flip-flop 88-4 is supplied with a timing signal ECCCLK0 while a reset input terminal thereof is supplied with a timing signal ECCCLK1. These timing signals ECCCLK0 and ECCCLK1 show an operating period of the error correction circuit 78 of the controller 73. When the error correction circuit 78 is operated, a peak current is generated. The flip-flop 88-4 generates a peak signal PEAK between timing signals ECCCLK0 and ECCCKL1.

The peak signal PEAK generated in the circuit shown in FIG. 18A is supplied to the gate of transistors 74-1 or 74-2 forming the monitor circuit MNT of the first and second chips shown in FIG. 1. The peak signal PEAK generated in the circuit shown in FIG. 18B is suppled to the gate of the transistor 74-3 forming the controller 73 shown in FIG. 1.

When the peak signal PEAK is activated (made high) by the monitor circuit of any of the first, second chips 71, 72 and controller 73, any of transistors 74-1, 74-2 and 74-3 of the first, second chips 71, 72 and controller 73 turns on. In this way, the monitor signal MOUT output from the inverters 75-1, 75-2 and 75-3 is activated (made high). As a result, the input condition of the AND gates 82-1 to 82-4 is not satisfied, chip or controller except chip or controller activating the peak signal PEAK is in a wait state when it moves to program or read sequence generating peak current. Thereafter, program, read, verify read or error correction end, and the input condition of any of AND gates 88-1, 88-2 and 88-4 is not satisfied. Thus, the peak signal PEAK is not activated (made low). Therefore, when other chip or controller is a wait state, it can move to program or read sequence generating the next current peak.

For example, if three chips are connected, the first chip attains a current peak mode, and second and third chips are in a wait state. In this state, when the current peak mode period of the first chip ends, the second and third chips simultaneously come into a current peak mode. Therefore, in the case of MCP or memory card including three chips or more, for example, priority is set in the order of the first, second and third chips. The priority is set in the following manner. Specifically, the time until the chip actually comes into a current peak mode from enabling to current peak mode is previously determined. For example, the first chip is set as 0 ns, the second chip is set to 100 ns, and the third chip is set as 200 ns. The foregoing setting is made, and thereby, the second chip comes into the current peak mode after 100 ns, and the third chip attains a wait state. When the second chip is released from the current peak mode, if the first chip does not come into the current peak mode, the third chip comes into the current peak mode after 200 ns. In this way, in the MCP or memory card including three chips, it is possible to prevent peak current from being overlapped.

FIG. 25 shows another modification example of the MCP or memory card having three chips. As shown in FIG. 25, according to the modification example, a first chip 71 outputs a first wait signal to second and third chips 72 and 100 in addition to a peak recognition signal. The second chip 72 outputs a second wait signal to the third chip 100. When the first wait signal supplied from the first chip 71 is enable, the second chip 72 does not come into a current peak mode. When the first or second wait signal is enable, the third chip 100 does not come into a current peak mode. The foregoing configuration is employed, and thereby, priority is given to the third chip.

Figure 19:
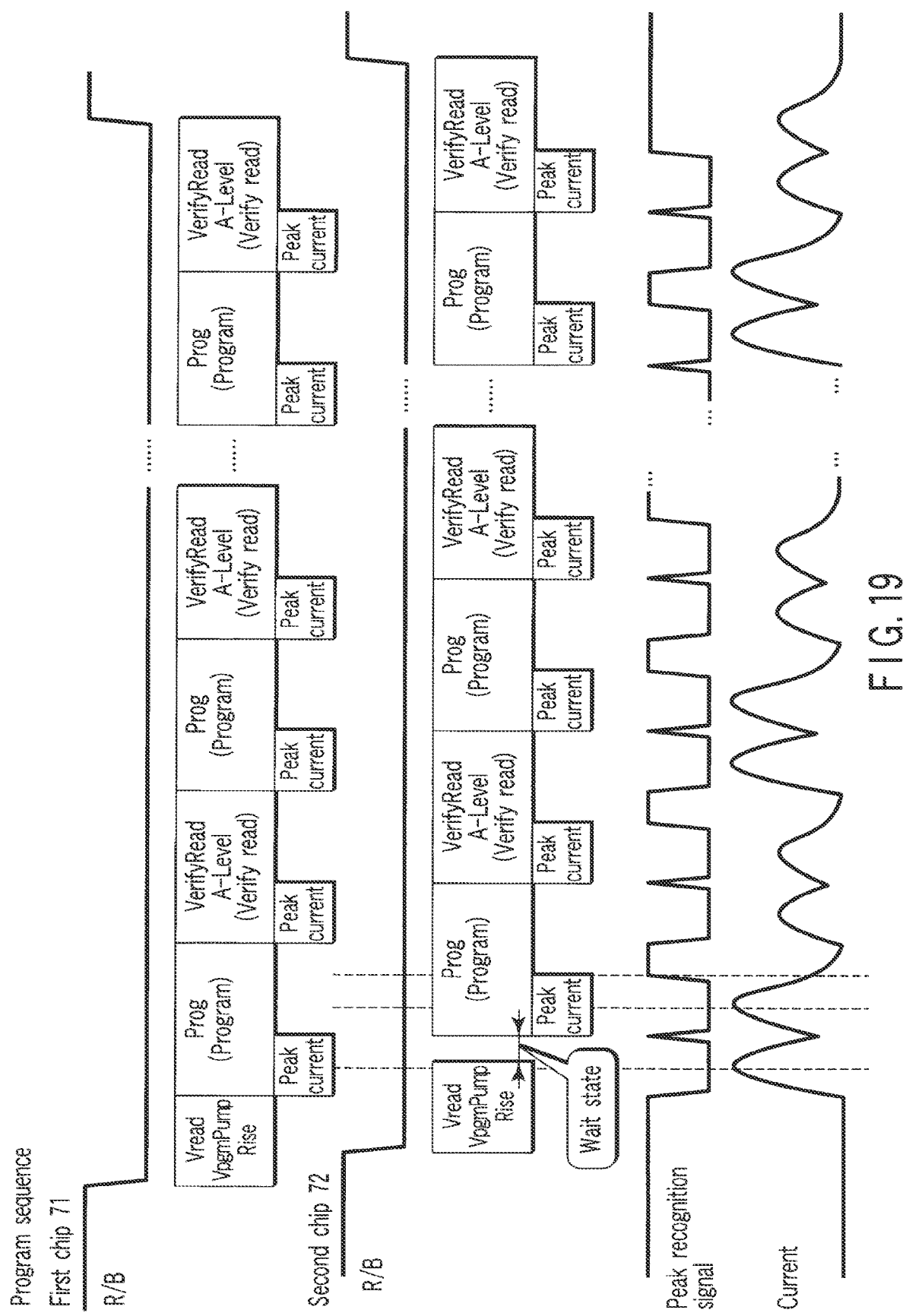
FIG. 19 is a view to explain a program sequence.

FIG. 19 shows the case where the second chip 72 makes a write operation in a slightly delayed state after the first chip 72 starts a write operation. The first and second chips 71 and 72 operate according to the write sequence of FIG. 11 to FIG. 13. When the operation starts, neither the first nor second chips 71 and 72 generate peak current. Thus, the peak recognition signal (each drain voltage of transistors 74-1, 74-2 and 74-3) goes high. Thereafter, when the first chip comes into a program state, peak current is generated. According to the foregoing operation, the peak recognition signal goes low. In this state, even if the second chip 72 transfers to a program state, the peak recognition signal is low, and the monitor signal MOUT is high. Thus, the second chip 72 is set to a wait state. Thereafter, the current of the first chip 71 is released from a peak state, and then, the peak recognition signal goes high according to the foregoing operation. Therefore, the monitor signal MOUT goes low, and thus, the second chip 72 is transferred from the wait state to a program state.

According to the first embodiment, the first, second chips 71, 72 and controller 73 are each provided with the monitor circuit MNT monitoring the peak current, and connected with each monitor circuit MNT. If peak current is generated in any of the first, second chips 71, 72 and controller 73, other circuits are set to a wait state. Therefore, it is possible to the peak current from being overlapped, and this serves to reduce large current consumption.

Each of the first, second chips 71, 72 and controller 73 has the monitor circuit MNT, and generates a peak signal PEAK during the period when peak current generates. In this way, other monitor circuit MNT connected via the communication line ML is set to the same state. Therefore, a plurality of chips and the controller are set to a wait state and released from the wait state using the foregoing simple configuration. As a result, an increase of the chip area can be prevented.

According to the first embodiment, when peak current is generated, the peak recognition signal is made low so that other chip does not transfer to a sequence of generating peak current. In this case, if communication time is taken between some chips, the peak recognition signal is made low slightly before peak current is generated. In this way, the generation of peak current may be indicated.

Voltage for charging the bit line is different between program, read and verify read. The peak current is larger in the program operation. Thus, when the peak current of the read and verify read operations has not problem, the peak current is monitored in the program operation only.

According to the first embodiment, the NAND flash memory includes two chips; in this case, it may include one or three chips or more.

For example, if three chips are used, a plurality of peak recognition signals is prepared. When the first chip is in a program state and generates peak current, other two chips are set not to come into a program state. On the other hand, when the first chip is in a read state and generates peak current, other two chips are not transferred to a program state. In this case, one chip only may be come into a read state.

Likewise, a plurality of peak recognition signals is used in accordance with the magnitude of peak current between plural NAND flash memories and the controller. In this way, it is possible to control so that the peak current of the MCP or card does not become large.

In FIG. 1, some memories and the controller are shown. In this case, if the current of the controller does not become the peak, communication is made between some memories only so that the peak is not overlapped.

Second Embodiment

As described above, each chip has an internal clock generation circuit for controlling program and read sequences. The cycle (period) of a clock signal generated from the clock generation circuit is set by trimming a resistance value in a die sort test. The cycle of the clock signal generated from the clock generation circuit of each chip is slightly different. Thus, as illustrated in FIG. 19, when the first and second chips repeat program and verify read operations, even if overlap of peak current is first prevented, the peak current is gradually overlapped. For this reason, a wait state is frequently generated; as a result, write performance is reduced. In order to solve the foregoing disadvantage, the second embodiment relates to technique of controlling a plurality of chips and the controller using one clock signal.

Figure 20:
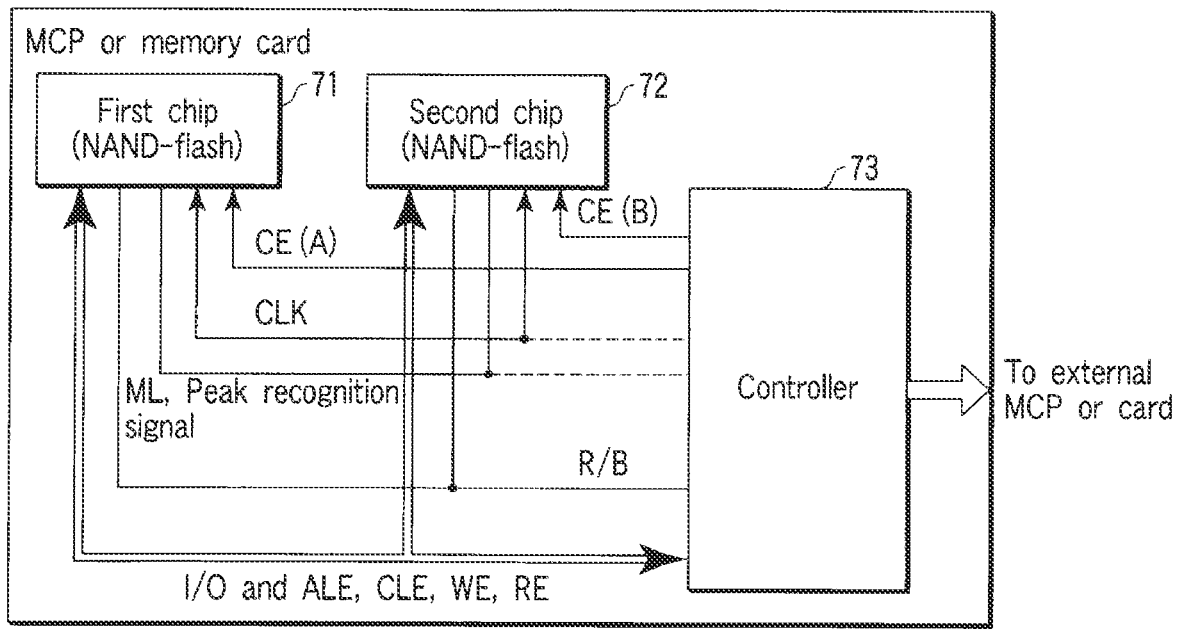
FIG. 20 is a view showing the configuration of a second embodiment.
Figure 21:
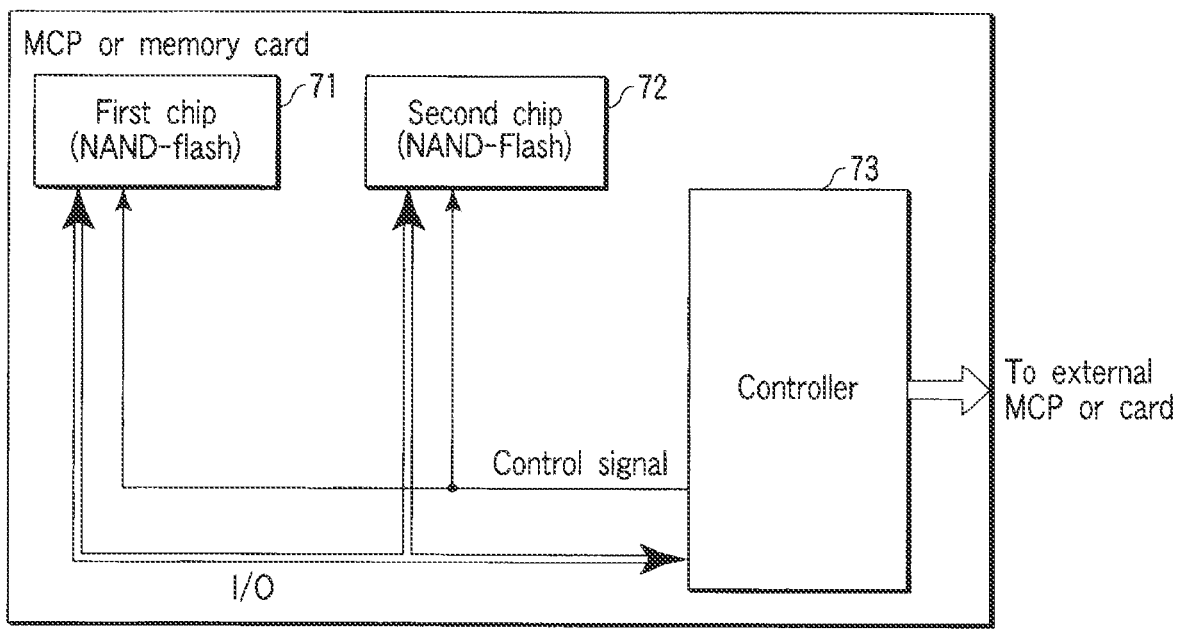
FIG. 21 is a view showing the configuration of a third embodiment.

FIG. 20 shows an MCP or card according to the second embodiment. In FIG. 20, the same reference numbers are used to designate the same portions as the first embodiment. According to the second embodiment, one of first, second chips 71, 72 comprising a NAND flash memory or controller 73 outputs a clock signal CLK. For example, if the controller 73 outputs the clock signals, the first and second chips 71 and 72 effects program, read and verify read operations based on the clock signal supplied from the controller 73.

According to the second embodiment, the first, second chips 71, 72 and the controller 73 are operated based on one clock signal. Thus, as compared with the case where a plurality of clock signals is used, it is possible to prevent the generation timing of peak current from being overlapped due to the shift between clock signals. Therefore, a wait operation is not frequently generated, and this serves to prevent a reduction of the operating speed.

According to the second embodiment, the number of the clock generation circuits is reduced; therefore, this serves to decrease the chip area.

Third Embodiment

According to the second embodiment, one of the first, second chips 71, 72 and the controller 73 outputs the clock signal. Based one the clock signal, the first, second chips 71, 72 and the controller 73 are operated.

On the contrary, according to the third embodiment, the controller 73 controls program and verify read operation of the first and second chips 71 and 72. Specifically, the controller controls the first and second chips 71 and 72 so that the generation timing of the first and second chips 71 and 72 is not overlapped. In this case, the first, second chips 71, 72 and the controller 73 have no need of mutually monitoring the operating state. Thus, the first and second chips 71 and 72 have no need to include the monitor circuit MNT. Therefore, according to the third embodiment, the circuit configuration is simplified as compared with the first and second embodiments.

According to the third embodiment, the controller 73 controls the first and second chips 71 and 72. The present invention is not limited to this configuration. For example, one of the first and second chips 71 and 72 may control the other thereof and the controller 73. In this case, one of the first and second chips recognizes whether or not address is own or other address.

Fourth Embodiment

According to the foregoing first to third embodiments, a plurality of chips comprising a NAND flash memory as a high-voltage generation circuit for program and verify read operations. On the contrary, according to the fourth embodiment, all NAND flash memory chips do not include the high-voltage generation circuit, and the following configuration is employed. Specifically, the controller 73 or one or some chips only of the NAND flash memory chips has a high-voltage generation circuit.

Figure 22:
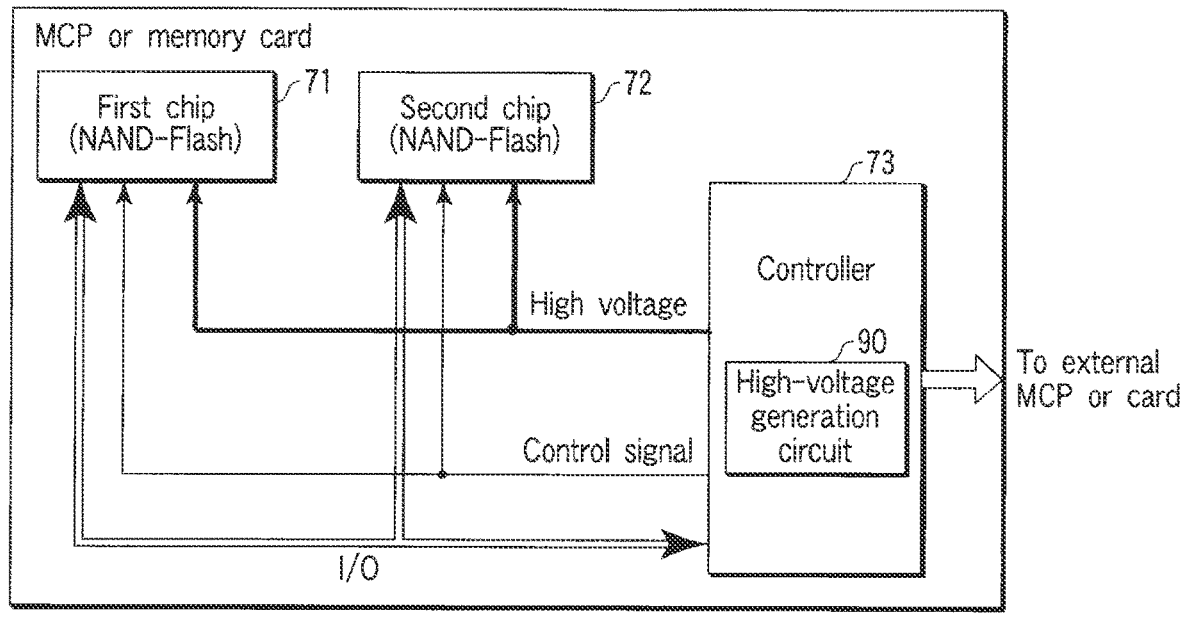
FIG. 22 is a view showing the configuration of a fourth embodiment.

FIG. 22 shows the configuration of an MCP or memory card according to the fourth embodiment. For example, FIG. 22 shows the case where the controller 73 includes a high-voltage generation circuit 90. The controller 73 supplies a control signal for controlling each operation of the first and second chips 71 and 72 based on the commands supplied to the first and second chips 71 and 72. The high-voltage generation circuit 90 of the controller 73 supplies a voltage required for program and verify read operations to one of the first and second chips 71 and 72, which are in an operating state according to the control signal.

In other words, the controller 73 carries out the following control. Specifically, one of the first and second chips 71 and 7 attains a current peak mode of program, read or verify read operation based on the command. In this case, when the other of the first and second chips 71 and 72 comes into the current peak mode of read or verify read operation, the controller 73 sets it to a wait state using the control signal. In this state, the high-voltage generation circuit 90 supplies a voltage required for the operating state chip. Thereafter, when the supply of high voltage required for program, read or verify read operation ends, that is, when the peak current ends, the controller 73 set the waiting state chip to an operating state, and then supplies a voltage required for the chip. For example, the read operation is smaller than the write operation in the current peak. Thus, in the case of the read operation, the high-voltage generation circuit may supply high voltage to several chips.

According to the fourth embodiment, one high-voltage generation circuit 90 included in the controller 73 supplies high voltage to the first and second chips 71 and 72. Thus, it is possible to prevent the peak current from being overlapped, and to reduce large current consumption. In general, according to the following high voltages, load increases when the word line rises. One of the high voltages is a program voltage Vpgm used in the program operation, and another is a voltage Vpass for setting a non-select cell to a conductive state. Another is a read voltage used in read or verify read operation. For this reason, if the first and second chips 71 and 72 simultaneously attain an operating state, the high-voltage generation circuit 90 requires performance capable of charging two times loads.

However, according to the control of the fourth embodiment, the first and second chips 71 and 72 having a NAND flash memory do not simultaneously attain an operating state. Therefore, the high-voltage generation circuit is sufficient in having performance capable of charging load equivalent to one chip. In addition, one high-voltage generation circuit only is used; therefore, the circuit configuration is simplified.

Figure 23:
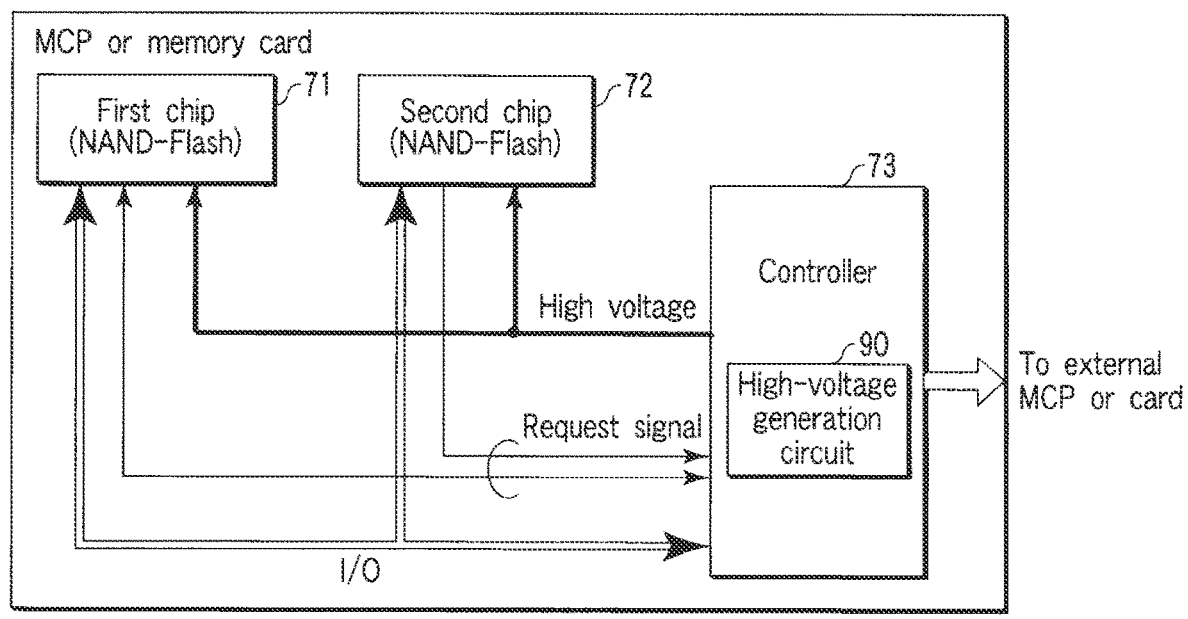
FIG. 23 is a view showing the configuration according to a modification example of the fourth embodiment.

FIG. 23 shows the configuration of an MCP or memory card according to a modification example of the fourth embodiment. According to the fourth embodiment, the controller 73 supplies the control signal to the first and second chips 71 and 72. The high-voltage generation circuit 90 supplies a high voltage required for one of the first and second chips 71 and 72. The supply of the high voltage is made based on the control by the controller 73.

On the contrary, according to the modification example, the first and second chips 71 and 72 generate a request signal for requesting the supply of high voltage. When the request signal is supplied, the controller 73 supplies a high voltage to one of the first and second chips 71 and 72, which first generates the request signal. Thus, the chip supplied with the high voltage attains an operating state; conversely, the chip supplied with no high voltage attains a wait state. Thereafter, when the supply of the high voltage ends, the high voltage is supplied to the waiting state chip. The foregoing configuration is employed, and thereby, it is possible to prevent the peak voltage from being overlapped, and to reduce large current consumption.

The fourth embodiment was described, referring to the case where a high-voltage generation circuit is provided for a controller or for some of a plurality of chips, and a high voltage is supplied to predetermined ones of the chips. However, the present invention is not limited to this, and a high-voltage generation circuit whose boosting capability is relatively low may be provided for each of the first and second chips 71 and 72, as shown in FIGS. 26 and 27. FIG. 26 illustrates the case where the first chip 71 uses a high voltage. In this case, the high-voltage generation circuits of the first and second chips 71 and 72 are operated simultaneously, and the output voltages of these high-voltage generation circuits are supplied to the word line drive circuit or another element of the first chip 71. FIG. 27 illustrates the case where the second chip 72 uses a high voltage. In this case, the high-voltage generation circuits of the first and second chips 71 and 72 are operated simultaneously, and the output voltages of these high-voltage generation circuits are supplied to the second chip 72. FIGS. 26 and 27 show an example of a two-chip configuration, but three-chip configuration may be used instead. Furthermore, only the selected ones of the high-voltage generating circuits of the chips may be operated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory system comprising:
   a first semiconductor memory chip;
   a second semiconductor memory chip;
   a controller chip;
   a first common signal line connected to the first semiconductor memory chip, the second semiconductor memory chip, and the controller chip; and
   a second common signal line connected to the first semiconductor memory chip, the second semiconductor memory chip, and the controller chip,
   wherein the first semiconductor memory chip and the second semiconductor memory chip perform operations specified by a signal on the second common signal line under timings instructed by a signal on the first common signal line.

2. The system according to claim 1, wherein
   the controller chip includes a signal generator, the signal generator being configured to generate the signal.

3. The system according to claim 1, wherein
   when one of the first semiconductor memory chip and the second semiconductor memory chip consumes a current larger than a reference current, the other one of the first semiconductor memory chip and the second semiconductor memory chip is set into a waiting state.

4. The system according to claim 3, wherein
   when a peak of the current of the one of the first semiconductor chip and the second semiconductor memory chip is past, the other one of the first semiconductor chip and the second semiconductor memory chip is returned from the waiting state.

5. The system according to claim 1, wherein the signal on the first common signal line includes a clock signal.

6. The system according to claim 1, wherein
the controller chip includes a clock signal generator configured to supply a clock signal to the first common signal line, and a control signal generator configured to supply a control signal to the second common signal line,
wherein
each of the first semiconductor memory chip and the second semiconductor memory chip operates under timings corresponding to the clock signal, and
when one of the first semiconductor memory chip and the second semiconductor memory chip consumes a current larger than a reference current, the control signal generator of the controller chip controls a signal level of the control signal such that the other one of the first semiconductor memory chip and the second semiconductor memory chip is set into a waiting state according to the control signal.

7. A method for controlling a semiconductor memory system,
the system comprising:
  a first semiconductor memory chip;
  a second semiconductor memory chip;
  a controller chip;
  a first common signal line connected to the first semiconductor memory chip, the second semiconductor memory chip and the controller chip; and
  a second common signal line connected to the first semiconductor memory chip, the second semiconductor memory chip, and the controller chip,
the method comprising:
  causing the first semiconductor memory chip and the second semiconductor memory chip to perform operations specified by a signal on the second common signal line under timings instructed by a clock signal on the first common signal line.

8. The method according to claim 7, wherein
the system further comprises:
  the controller chip includes a clock signal generator, and
the method further comprises:
  generating the clock signal by the clock signal generator of the controller.

9. The method according to claim 7, further comprising:
when one of the first semiconductor memory chip and the second semiconductor memory chip consumes a current larger than a reference current, causing the other one of the first semiconductor memory chip and the second semiconductor memory chip to be set into a waiting state.

10. The method according to claim 9, wherein
when a peak of the current of the one of the first semiconductor chip and the second semiconductor memory chip is past, causing the other one of the first semiconductor chip and the second semiconductor memory chip to return from the waiting state.

11. The method according to claim 7, wherein
the system further comprises:
  the controller chip includes a clock signal generator configured to supply the clock signal to the first common signal line, and a control signal generator configured to supply a control signal to the second common signal line,
the method further comprises:
  operating each of the first semiconductor memory chip and the second semiconductor memory chip under timings corresponding to the clock signal, and
  when one of the first semiconductor memory chip and the second semiconductor memory chip consumes a current larger than a reference current, causing the control signal generator of the controller chip to control a signal level of the control signal such that the other one of the first semiconductor memory chip and the second semiconductor memory chip is set into a waiting state according to the control signal.

12. The system according to claim 1, further comprising:
a third common signal line connected to the first semiconductor memory chip and the controller chip; and
a fourth common signal line connected to the second semiconductor memory chip and the controller chip,
wherein the first semiconductor memory chip is activated or deactivated in response to a signal on the third common signal line, and the second semiconductor memory chip is activated or deactivated in response to a signal on the fourth common signal line.

13. The system according to claim 12, wherein
the controller chip includes an enable signal generator configured to supply a chip enable signal to each of the first semiconductor memory chip and the second semiconductor memory chip.

* * * * *